United States Patent
Rangarajan et al.

(10) Patent No.: US 7,084,988 B1
(45) Date of Patent: Aug. 1, 2006

(54) SYSTEM AND METHOD FOR CREATION OF SEMICONDUCTOR MULTI-SLOPED FEATURES

(75) Inventors: Bharath Rangarajan, Santa Clara, CA (US); Bhanwar Singh, Morgan Hill, CA (US); Ramkumar Subramanian, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 601 days.

(21) Appl. No.: 09/893,803

(22) Filed: Jun. 28, 2001

(51) Int. Cl.
  *G01B 11/24* (2006.01)
(52) U.S. Cl. ..................... 356/601; 356/636
(58) Field of Classification Search .............. 356/601, 356/636
  See application file for complete search history.

(56) References Cited

U.S. PATENT DOCUMENTS

| | | | | |
|---|---|---|---|---|
| 5,629,772 A | * | 5/1997 | Ausschnitt | 356/625 |
| 5,658,418 A | * | 8/1997 | Coronel et al. | 156/345.25 |
| 5,661,669 A | * | 8/1997 | Mozumder et al. | 702/84 |
| 5,719,495 A | * | 2/1998 | Moslehi | 324/158.1 |
| 6,643,557 B1 | * | 11/2003 | Miller et al. | 700/110 |

* cited by examiner

*Primary Examiner*—Richard A. Rosenberger
(74) *Attorney, Agent, or Firm*—Amin & Turocy, LLP

(57) ABSTRACT

A system and method for monitoring the creation of semiconductor features with multi-slope profiles by employing scatterometry is provided. The system includes a wafer partitioned into one or more portions and one or more light sources, each light source directing light to one or more devices etched on a wafer, the devices having multi-sloped profiles. Reflected light is collected and converted into data by a measuring system. The data is indicative of the etching at the one or more portions of the wafer. The measuring system provides the data to a process analyzer that determines whether adjustments to etching components are necessary by comparing the data to stored etch parameter values. The system also includes etching components. At least one etch component corresponds to a portion of the wafer and performs the etching thereof. The process analyzer selectively controls the etch components to promote consistent etching of multi-slope profiles/features to compensate for wafer to wafer variations.

28 Claims, 21 Drawing Sheets

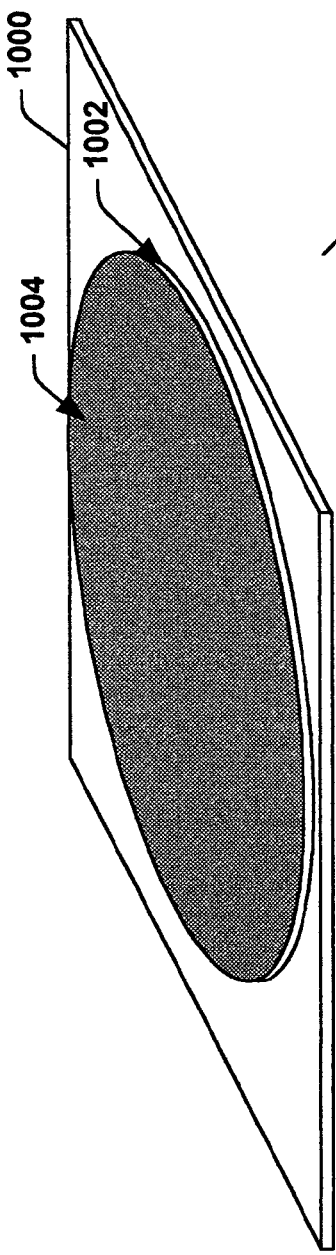
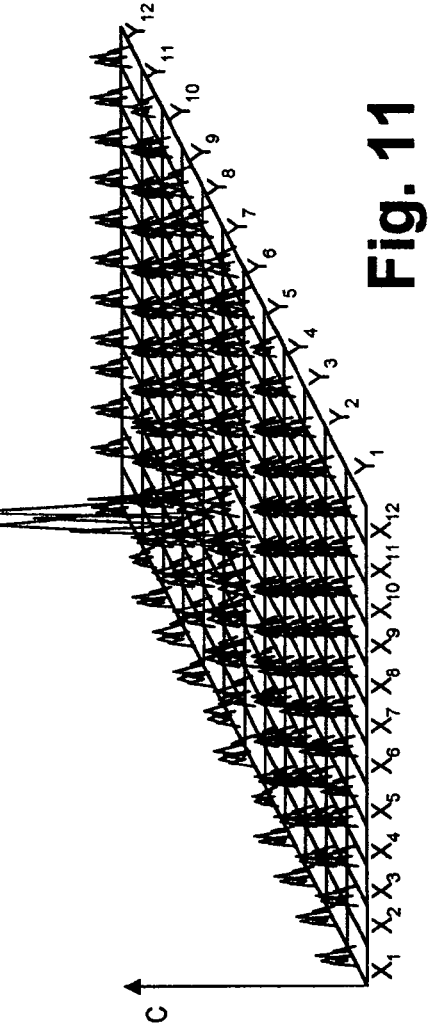
Fig. 12
Fig. 10
Fig. 11

SURFACE NORMAL   SPECULARLY REFLECTED BEAM

SYSTEM AND METHOD FOR CREATION OF SEMICONDUCTOR MULTI-SLOPED FEATURES

TECHNICAL FIELD

The present invention relates generally to semiconductor processing, and in particular to a system for regulating etching of multi-sloped features.

BACKGROUND

In the semiconductor industry, there is a continuing trend toward more complex feature shapes. To achieve these more complex feature shapes there have been, and continue to be, efforts directed at creating more precise features, with more precise critical dimensions and angles. In order to reproduce such complex devices from wafer to wafer and within a wafer, finer control of lithographic processes (e.g., etch processes) is required to mitigate structural variations from feature to feature.

The requirement of small, complex features with close spacing between adjacent features requires sophisticated manufacturing techniques, including high-resolution photolithographic processes, and controlling post development etch trim processes. Fabricating a semiconductor using such sophisticated lithography techniques may involve a series of steps including cleaning, thermal oxidation or deposition, masking, developing, etching, baking and doping.

In general, lithography refers to processes for pattern transfer between various media. It is a technique used for integrated circuit fabrication in which a silicon slice, the wafer, is coated uniformly with a radiation-sensitive film, the photoresist. The photoresist coated substrate is baked to evaporate any solvent in the photoresist composition and to fix the photoresist coating onto the substrate. The baked coated surface of the substrate is next subjected to selective radiation using a mask; that is, a mask is employed to effect an image-wise exposure to radiation. The mask permits radiation to contact certain areas of the photoresist and prevents radiation from contacting other areas of the photoresist. This selective radiation exposure causes a chemical transformation in the exposed areas of the photoresist coated surface. Types of radiation commonly used in microlithographic processes include visible light, ultraviolet (UV) light and electron beam radiant energy. After selective exposure, the photoresist coated substrate is treated with a developer solution to dissolve and remove either the radiation-exposed or the unexposed areas of the photoresist (depending upon whether a positive photoresist or a negative photoresist is utilized) resulting in a patterned or developed photoresist.

The process of manufacturing semiconductors, or integrated circuits (commonly called ICs, or chips), typically consists of more than a hundred steps, during which hundreds of copies of an integrated circuit may be formed on a single wafer. Each integrated circuit may have a large number (e.g., millions) of features with a variety of shapes. Generally, the process involves creating several patterned layers on and into the substrate that ultimately forms a complete integrated circuit. This layering process creates electrically active regions in and on the semiconductor wafer surface. The accuracy of the reproduction of the shapes of multi-sloped features are important to the proper separation and operation of such electrically active regions. Conventional systems suffer from not being able to adapt processes to the individual characteristics associated with the multi-sloped features on a wafer and thus yields may be lower than are possible if more sophisticated monitoring and adapting techniques were employed.

Due to the extremely fine patterns associated with complex multi-sloped features that are exposed on the photoresist, controlling the multi-slope profile etch process is a significant factor in achieving and reproducing desired critical dimensions. Regulating the etching process in-situ may facilitate obtaining more precise, more complex multi-sloped feature profiles and thus increase the quality of the complicated devices being manufactured on the wafer. Even slight changes in etch process conditions can substantially alter the etch accuracy of the multi-sloped feature profiles, resulting in poor feature formation and IC performance. Conventional systems may not be able to account for such slight changes, and thus less precise features may be etched. Thus, there remains a need for a more precise system for monitoring the formation of multi-sloped features.

SUMMARY

The following presents a simplified summary of the invention in order to provide a basic understanding of some aspects of the invention. This summary is not an extensive overview of the invention. It is not intended to identify key or critical elements of the invention and it is not intended to delineate the scope of the invention. Its sole purpose is to present some concepts of the invention in a simplified form as a prelude to the more detailed description that is presented later.

The present invention provides a system that facilitates controlling the etching of multi-sloped features. An exemplary system may employ one or more light sources arranged to project light onto one or more such multi-sloped devices being fabricated on a wafer and one or more light sensing devices (e.g., photo detector, photodiode) for detecting light reflected by the one or more multi-sloped devices. The light reflected from the one or more devices is indicative of at least one parameter of the etching process (e.g., percent completion of etching, depth of etching, angle of profile) that may vary in correlation with the etching process.

One or more etching components may be arranged to correspond to different wafer portions whereupon multi-sloped features are being fabricated. It is to be appreciated that any suitable etching component may be employed with the present invention. In addition, it is to be appreciated that directional etching components may 2 be employed in accordance with the present invention. Such etching components are known in the art, and thus discussion thereof is limited herein for the sake of brevity. Each etching component may be responsible for etching one or more particular wafer portions. The etching components are selectively controlled by the present invention to produce a desired etch pattern. The etch process is monitored by the system by comparing the measured profiles and/or dimensions of the multi-sloped features on the wafer to stored desired profiles and/or dimensions, which may be stored as scatterometry signatures. As a result, the etch process conditions are optimized for multi-sloped feature formation, resulting in increased precision in multi-sloped feature profiles and corresponding increases in yield.

One particular aspect of the invention relates to a system for regulating etching of multi-sloped features. At least one etching component, regulated by a etch component controller, operates to etch at least one portion of a wafer. A light source directs light toward or at a wafer having at least one multi-sloped feature being fabricated thereon. The light reflected off the wafer is collected by a light receiver. A measuring system measures parameters associated with the at least one feature by interpreting or converting the collected light into measured parameter data. A process analyzer is operatively coupled to the measuring system and the etch component controller. The process analyzer receives the measured parameters from the measuring system and analyzes the measured parameters to determine whether adjustments to the etching components are needed to facilitate more precise fabrication of multi-sloped features.

Yet another aspect of the present invention relates to a method for in-situ regulation of an etch process applied to a multi-sloped semiconductor feature formed on a wafer. The method includes partitioning the wafer into a plurality of portions, etching at least one multi-sloped feature on at least one portion of the wafer, directing light onto at least one portion of the wafer and collecting light reflected from the at least one portion. The collected light is analyzed to determine the acceptability of the formation of the multi-sloped feature and selectively controlling one or more etching components to regulate the etching of the multi-sloped semiconductor feature on the at least one portion.

To the accomplishment of the foregoing and related ends, the invention, then, comprises the features hereinafter fully described and particularly pointed out in the claims. The following description and the annexed drawings set forth in detail certain illustrative examples of the invention. These examples are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIG. 10 is a perspective illustration of a substrate that may be processed in accordance with the present invention.

FIG. 11 is a representative three-dimensional grid map of a wafer illustrating etching acceptability measurements taken at grid blocks of the grid map in accordance with the present invention.

FIG. 12 is an etching acceptability measurement table correlating the etching acceptability measurements of FIG. 111 with desired values for the etching acceptability measurements in accordance with the present invention.

DETAILED DESCRIPTION

Figure 1:
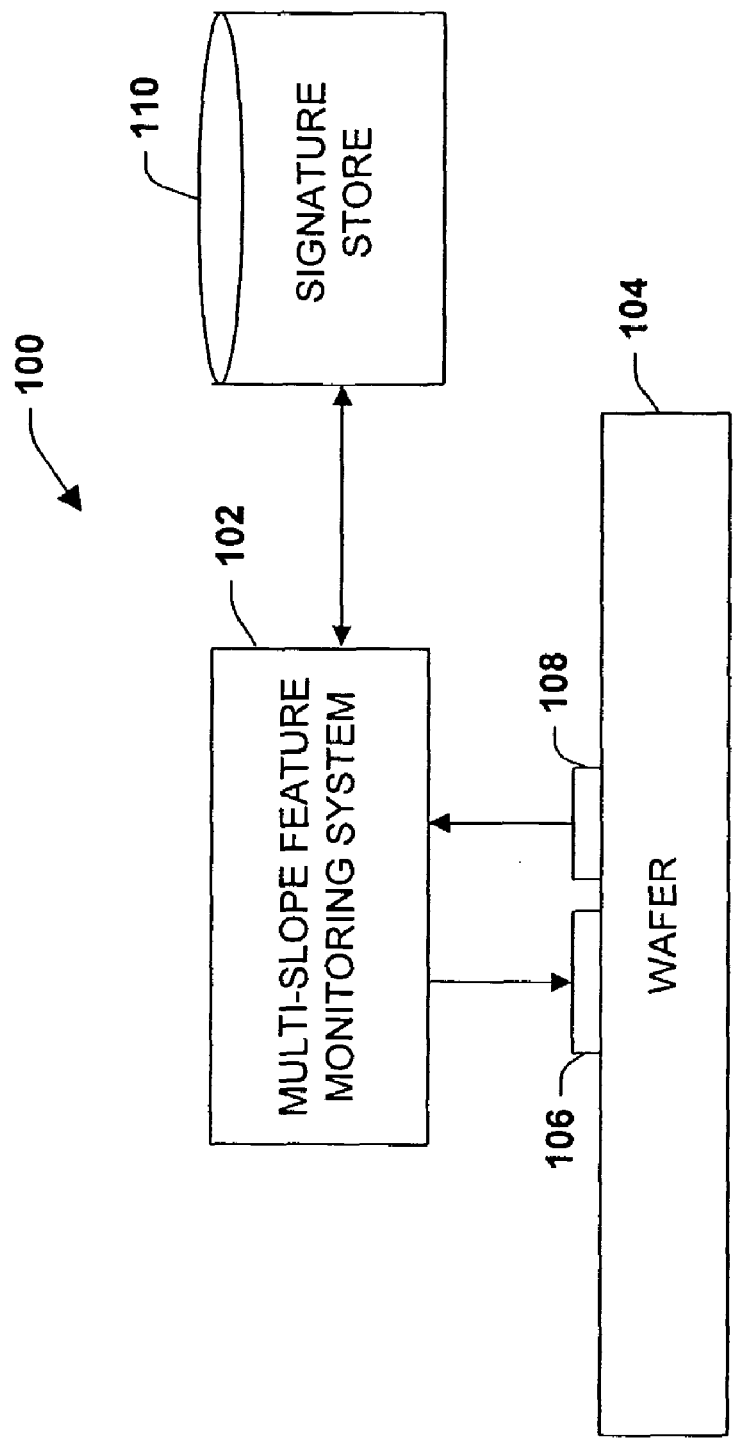
FIG. 1 is schematic block diagram of a multi-sloped feature monitoring system in accordance with the present invention.

The present invention will now be described with reference to the drawings, wherein like reference numerals are used to refer to like elements throughout. The present invention will be described with reference to a system for controlling etching of multi-sloped features using one or more etching components, an etching component controlling system and a scatterometry system including one or more light sources and one or more light detecting devices. The following detailed description is of the best modes presently contemplated by the inventors for practicing the invention. It should be understood that the description of these preferred embodiments are merely illustrative and that they should not be taken in a limiting sense.

Referring initially to FIG. 1, a system 100 for monitoring the formation of multi-sloped features is illustrated. The system include a multi-sloped feature monitoring system 102 operably connected to a signature store 110. The signature store 110 can store data in data structures including, but not limited to one or more lists, arrays, tables, databases, stacks, heaps, linked lists and data cubes. The signature data store 110 can reside on one physical device and/or may be distributed between two or more physical devices (e.g., disk drives, tape drives, memory units). The multi-sloped feature monitoring system 102 can be a standalone device and can also be distributed between two or more cooperating devices and/or processes. Further, the multi-sloped feature monitoring system 102 can reside in one physical or logical device (e.g., computer, process).

The multi-sloped feature monitoring system 102 directs light at a wafer 104, upon which one or more features 106 and/or gratings 108 are fabricated. The light reflects back from the wafer 104 and/or one or more features 106 and/or gratings 108 and is collected by the multi-sloped feature monitoring system 102 which then processes the light to generate one or more signatures generated by the reflected light. The signatures may then be compared to signatures stored in the signature store 110 to determine whether the fabrication of the multi-sloped features is proceeding in a desired manner. If the fabrication is not proceeding as desired, then the multi-sloped feature monitoring system 102 can produce feedback data that can be employed to alter the fabrication process and/or may mark the wafer 104 and/or a portion of the wafer 104 for discard. If the signatures indicate that the fabrication of the multi-sloped features has completed with desired critical dimensions (e.g., size, shape, angles) then the wafer 104 may be marked to allow further processing, for example. Additionally and/or alternatively, data collected by the multi-sloped monitoring system 102 can be employed to facilitate reproducing process conditions from wafer to wafer, and run to run. Thus, adaptations noted in earlier processing runs can be employed to improve later processing runs.

Figure 2:
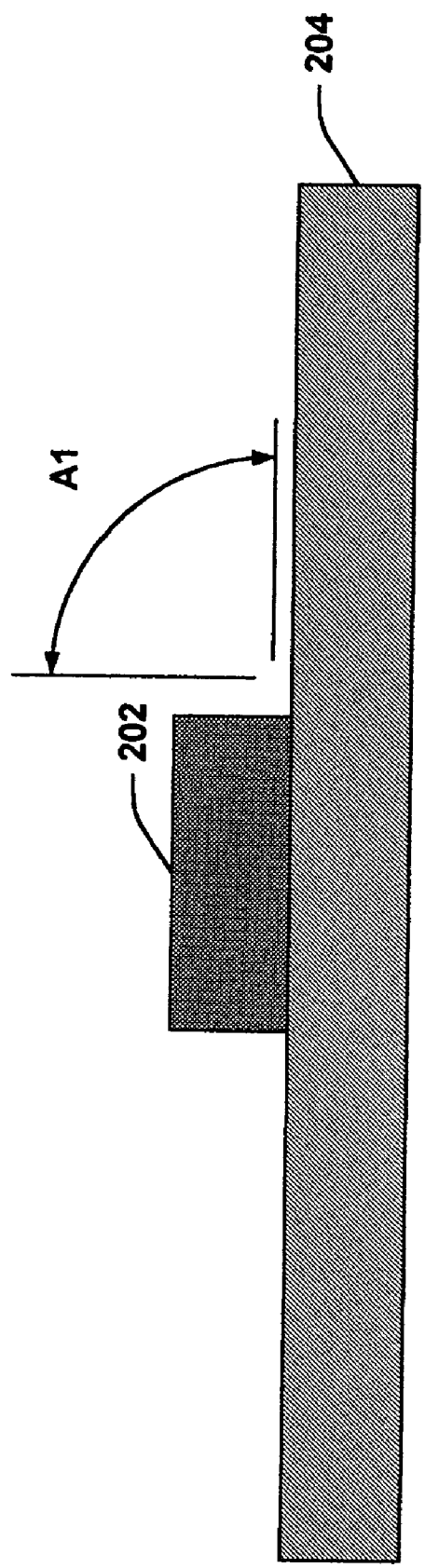
FIG. 2 illustrates a device with a single-sloped profile.

Turning now to FIG. 2, a no-slope feature device 202 is illustrated. The no-slope feature device 202 is fabricated upon a wafer 204. Such no-slope features 202 can include, but are not limited to, gate structures, contact holes, interconnects, and the like. The feature 202 is known as a no-slope feature because its top surface is substantially planar or flat, thus exhibiting no slope. Conventional etch processes may be used to form the feature 202. Since the feature 202 exhibits no slope, reproducing process conditions that produce acceptable no-slope features from wafer to wafer may be accomplished with relative ease despite the occurrence of wafer-to-wafer variations. Thus, parameters associated with forming such no-slope features may be pre-computed, and/or average values and/or typical range values may be employed in producing such features. Such pre-computed, average or typical parameter ranges can produce the feature 202 with a desired angle A1 between the feature wall and the wafer 204. Even though such pre-computed, average or typical parameter ranges can produce the feature 202 with a desired angle A1, there may be variation in the angle A1 due to employing such pre-computed, average or typical parameter ranges. Thus, even though acceptable features may be produced, more precise features could be produced if the processes employed to produce the features were more closely monitored and provided with in-situ information that could be employed to control the fabrication processes. The variations in the angle A1 are exacerbated when more complicated features are fabricated.

Figure 3:
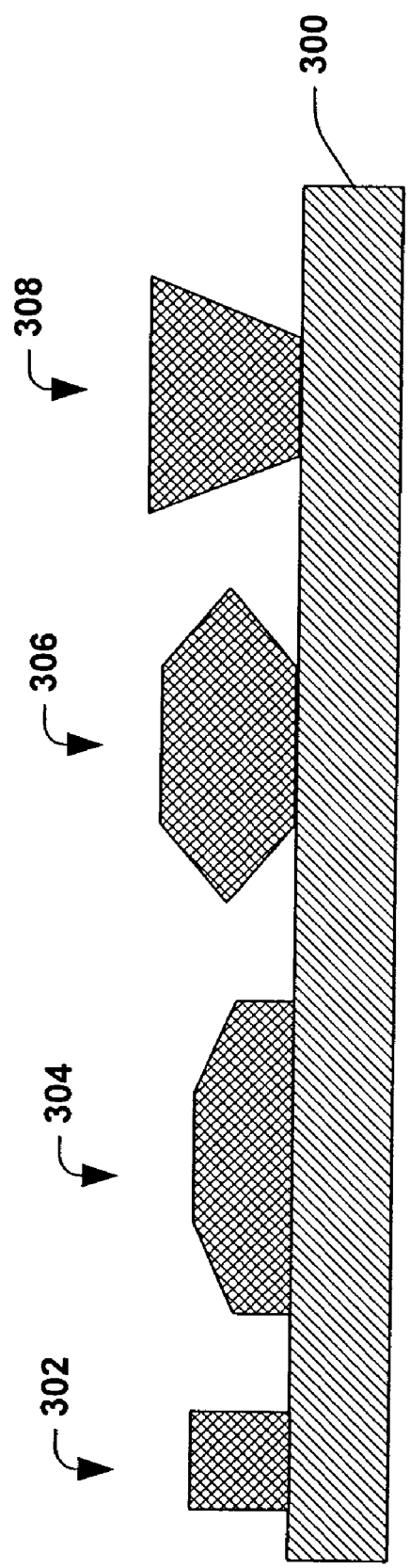
FIG. 3 illustrates a single-sloped feature and multi-sloped semiconductor features formed in accordance with the present invention.

Thus, turning to FIG. 3, a no-slope feature 302 and three multi-sloped features 304, 306 and 308 are illustrated. Unlike simple no-slope devices, multi-sloped features are typically characteristic of complex devices. Examples of complex devices include T-top gate structures, multiple level interconnections, and the like. As shown in FIG. 3, the multi-sloped features 304, 306 and 308 have a particularly complex profile as compared to the no-slope feature 302. The complex profiles must be reproduced within a wafer and between wafers without substantial variation. Furthermore, with desires for ever-increasing packing densities, the shape and location of such features must be more precisely controlled. Therefore in order to compensate for intra-wafer variations and wafer to wafer variations, and to allow for more precise, in-situ control of multi-sloped feature fabrication, a system and method is required to monitor multi-sloped feature fabrication and to detect variations in the etched multi-sloped features.

Figure 4:
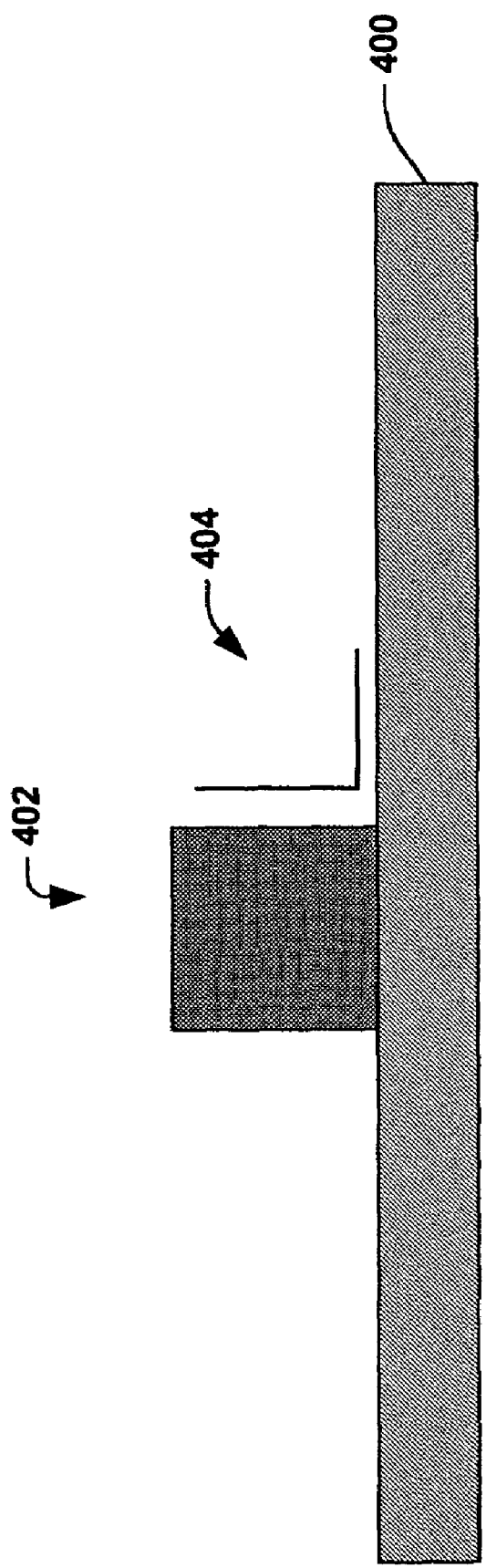
FIG. 4 illustrates a device with a single-sloped profile and an angle measurement associated with the device in accordance with an aspect of the present invention.

FIG. 4 presents a no-slope feature 402 fabricated on a wafer 400 to illustrate that although the present invention concerns monitoring the fabrication of features having multi-sloped profiles, that a no-slope feature can be considered a simple case of a multi-sloped profile, where angles associated with the analyzing the feature 402 are substantially right angles. Thus, the angle 404 is illustrated as being substantially a right angle. Light reflected from the wafer 400 and the feature 402 can be employed to determine parameters associated with fabricating the feature 402 (e.g., height, width, angle of side walls in relation to wafer 400).

Figure 5:
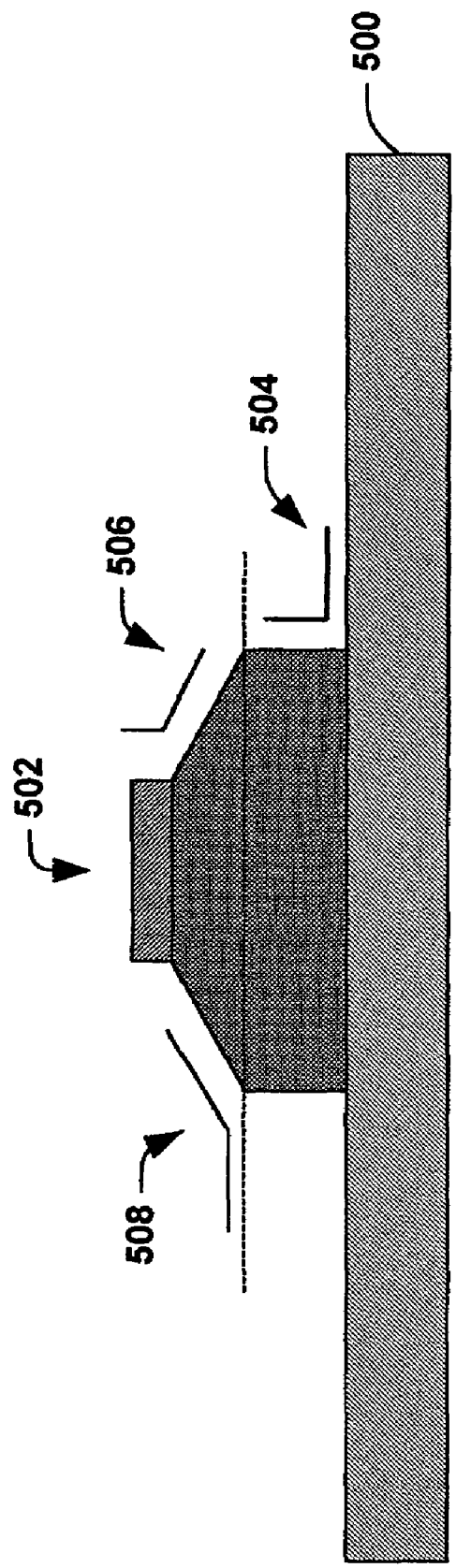
FIG. 5 illustrates a device with a multi-sloped profile and angle measurements associated with the device in accordance with the present invention.

FIG. 5 presents a feature 502 with a multi-slope profile fabricated on a wafer 500. The geometry of the feature 502 is more complicated than the no-slope feature 402 (FIG. 4). For example, whereas the angles associated with feature 402 (FIG. 4) were substantially right angles, the feature 502 includes angles 504, 506 and 508, wherein only angle 504 is substantially a right angle. Techniques for fabricating features with such angles are known in the art, but techniques for in situ monitoring of the fabrication process, including real-time feedback control that facilitates producing more precise features with critical dimensions (e.g., angles, height, width, slopes) within tighter tolerances provide advantages over such conventional systems. Light reflected from the wafer 500 and/or the feature 502 will be influenced by the angles 504, 506 and 508, so that unique signatures may be generated, which facilitates comparing such signatures to stored signatures to determine whether an acceptable feature is being fabricated and whether the fabrication process should be adapted.

Figure 6:
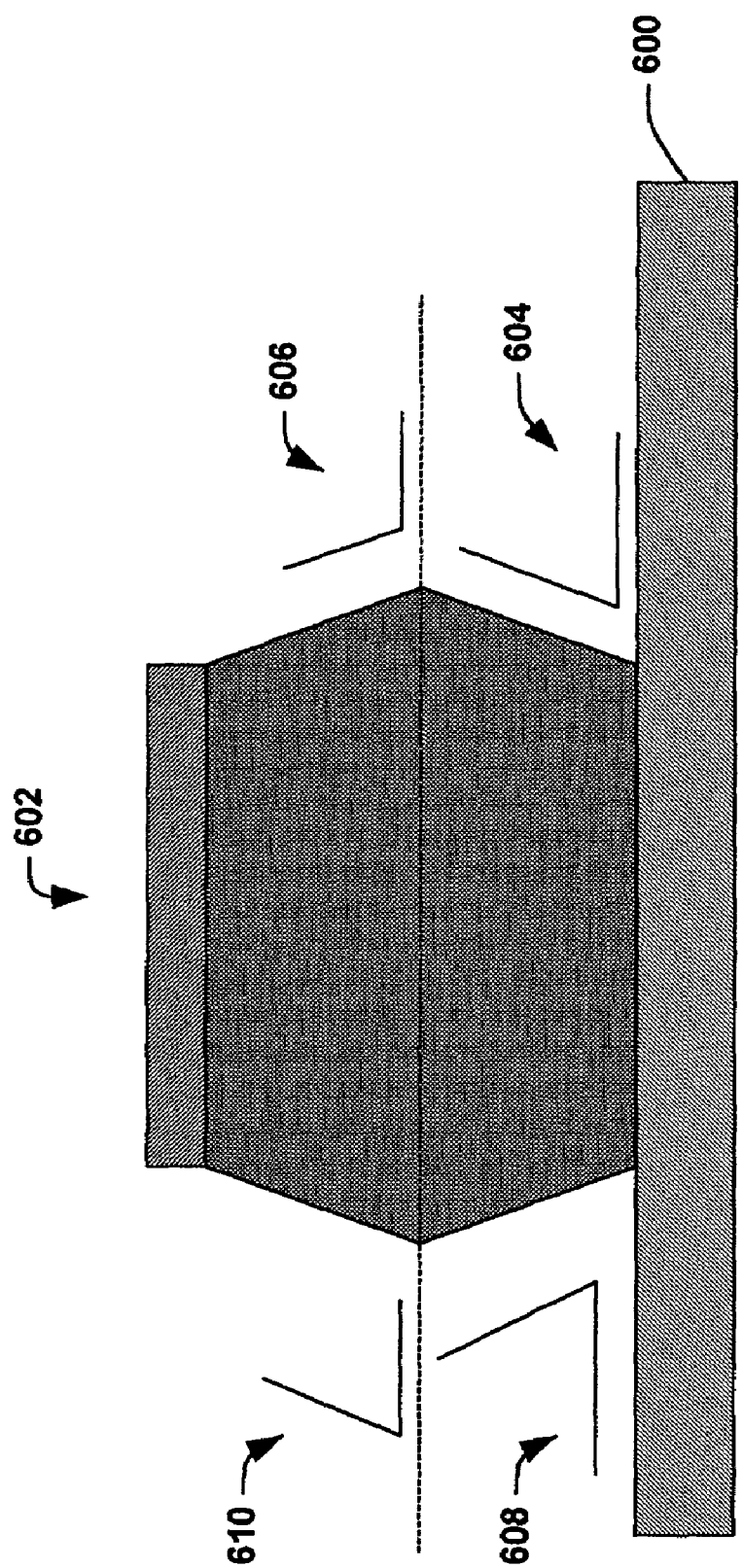
FIG. 6 illustrates a device with a multi-sloped profile and angle measurements associated with the device in accordance with the present invention.

FIG. 6 presents a feature 602 with a different multi-slope profile fabricated on a wafer 600. Again, the geometry of the feature 602 is more complicated than the geometry of either feature 402 (FIG. 4) or feature 502 (FIG. 5). Techniques for constructing the feature 602, including multi-layer techniques are known in the art, but such techniques can benefit from in situ monitoring, which facilitates producing real-time feedback control to adapt the fabrication process. By way of illustration, the angle 610 may vary depending on the angle 608. As angle 608 becomes more acute, the feature 602 may benefit from the angle 610 being more acute. Similarly, the angle 606 may depend on the angle 610. As the angle 610 becomes more acute, feature 602 may benefit from the angle 606 becoming more obtuse. Thus, by monitoring signatures associated with light reflected from the feature 602 and/or the wafer 600 during the fabrication process, subsequent dependent angles may be fashioned in response to preceding controlling angles, which may vary from feature to feature, or wafer to wafer due to intra-wafer variations and/or wafer to wafer variations, for example. Being able to account for a variation at a preceding step (e.g., formation of angle 608) by adapting a subsequent step (e.g., formation of angle 610) can increase yields and reliability of semiconductors fabricated with features including multi-sloped profiles.

Figure 7:
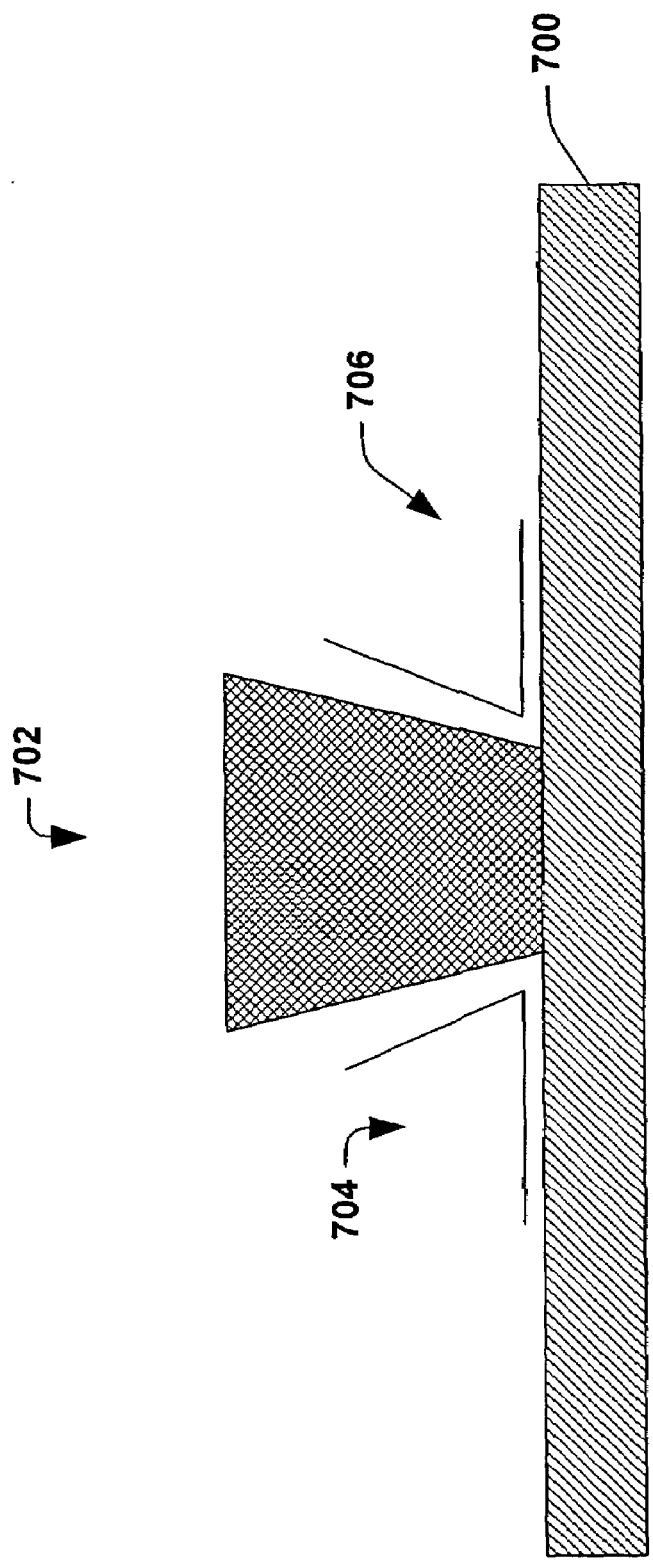
FIG. 7 illustrates a device with a multi-sloped profile and angle measurements associated with the device in accordance with the present invention.

FIG. 7 presents a feature 702 with a different multi-slope profile fabricated on a wafer 700. Again, the geometry of the feature 702 is more complicated than the geometry of feature 402 (FIG. 4) Techniques for constructing the feature 702 are known in the art, but such techniques can benefit from in situ monitoring, which facilitates producing real-time feedback control to adapt the fabrication process. By way of illustration, the angles 704 and 706 may vary depending on the height of the feature 702. As the feature 702 becomes taller, the feature 702 may benefit from the angle 704 being more obtuse and the angle 706 being more obtuse. Thus, by monitoring signatures associated with light reflected from the feature 702 and/or the wafer 700 during the fabrication process, dependent angles may be fashioned in response to developing controlling parameters (e.g., height), which may vary from feature to feature, or wafer to wafer due to intra-wafer variations and/or wafer to wafer variations, for example. Being able to account for a variation during fabrication (e.g., height of feature 702) by adapting concurrently developing parameters (e.g., formation of angle 704) can increase yields and reliability of semiconductors fabricated with features including multi-sloped profiles. Additionally and/or alternatively, data collected while monitoring the formation of the feature 702 can be employed to facilitate reproducing process conditions in subsequent fabrication processes employed to create features similar to feature 702. Thus, adaptive learning techniques can be employed to improve semiconductor feature manufacture, providing advantages over conventional systems.

Figure 8:
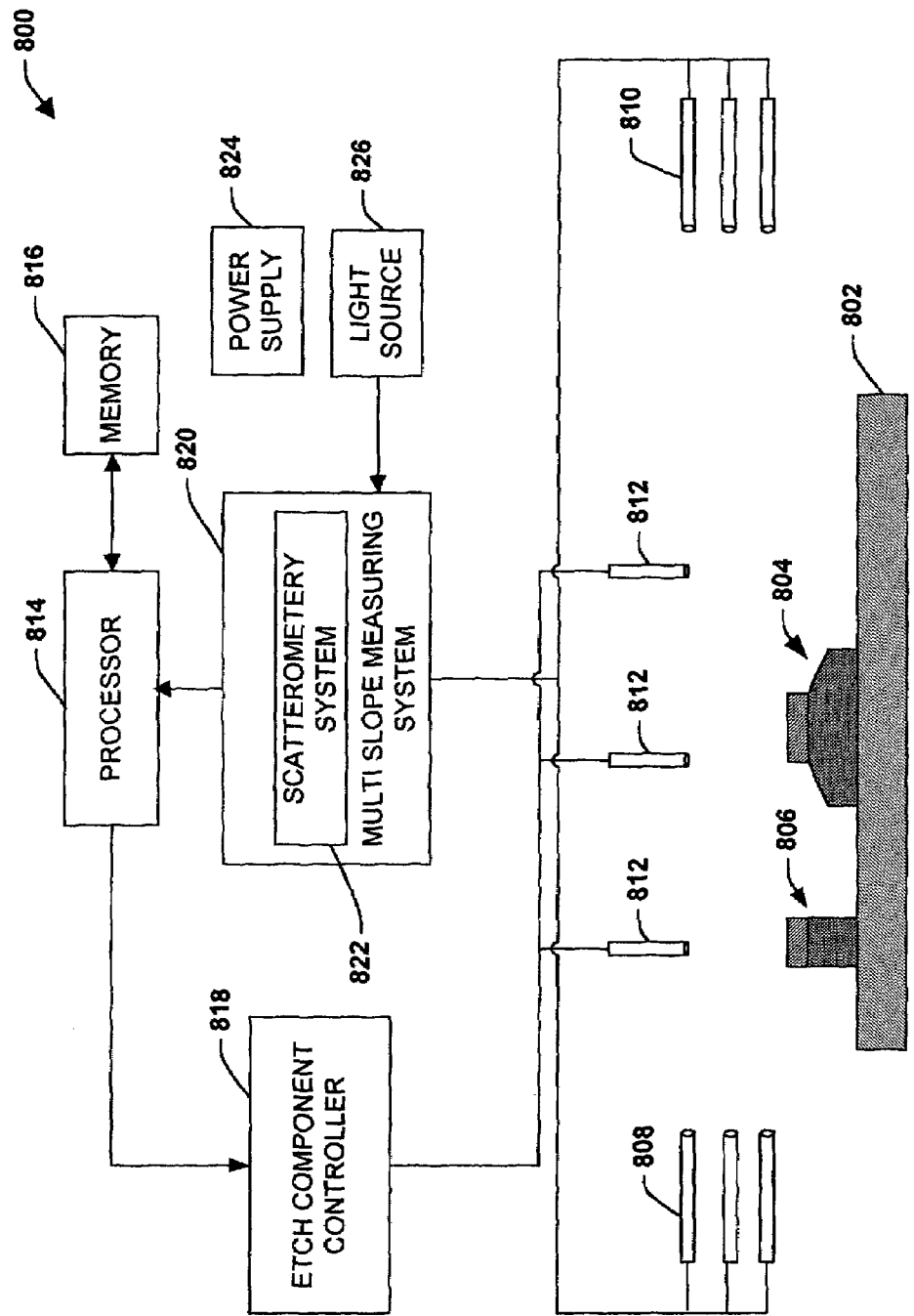
FIG. 8 is schematic block diagram of a multi-sloped feature monitoring system in accordance with the present invention.

Turning now to FIG. 8, a system 800 for in-situ regulation of etch processing of multi-sloped feature formation is shown. The system 800 for regulating in-situ etch processing associated with multi-sloped feature formation includes a light source 826 that supplies light to light sources 808 via a multi-slope measuring system 820, which is described below. The light source 826 may be a frequency-stabilized laser, however, it will be appreciated that any laser or other light source (e.g., laser diode or helium neon (HeNe) gas laser) is suitable to carry out the present invention.

One or more light sources 808 are directed at the wafer 802, including features 804 and 806 being formed thereon. Light reflected from the wafer 802 and/or the features 804 and 806 is detected and collected by one or more light receivers 810 (e.g., photo detector, photo diodes). The light received is communicated or transmitted to the multi-slope measuring system 820. It should be appreciated that the wafer may be divided or partitioned into portions or grid blocks, wherein each portion or grid block has at least one or at least a part of one multi-sloped feature included thereon.

The multi-slope measuring system 820 collects the received light and interprets or converts the received light into measurements associated with the wafer 802 (and features 804, 806 included thereon). The measurements correspond to etch parameters. Etch parameters include, but are not limited to, feature profile (e.g., one or more angles), feature thickness and feature width. It should be appreciated that the multi-slope measuring system 820 may be programmed to measure one or more etch parameters depending on the desired use or application of the system 800. The multi-slope measuring system 820 performs the interpretation or conversion of received light into data measurements using one or more conventional scatterometry system 822 and related methods. The data measurements (measured etch parameter data) are then transmitted to a processor 814. The processor 814 is operatively coupled to the multi-slope measuring system 820 and to an etch component controller 818. The etch component controller 818 selectively directs and controls one or more etch components 812. Adjusting the etch components 812 facilitates reproducing etch conditions within different regions of a wafer and from one wafer to another in order to compensate for intra-wafer and/or wafer-to-wafer variations. Furthermore, adjusting the etch components 812 facilitates etching a feature with desired critical dimensions (e.g., profile (e.g., one or more angles), feature thickness and feature width). Etch components can include, but are not limited to those components directed to etch chemistry, exposure duration, developing, post etch bake duration and temperature, mask-to-wafer alignment and etch selectivity.

After receiving the measured data associated with the wafer 802 and features 804 and 806 thereon, the processor 814 determines whether adjustments to the etch components 812 are needed in order to facilitate producing the desired critical dimensions in the features 804 and 806 and/or for reproducing etch process conditions for one or more wafers to compensate for variations among the wafers. The measured data associated with the wafer 802 may correspond to one or more portions or grid blocks of the wafer. Alternatively or in addition, the measured data may correspond to the whole wafer.

The measured data are direct measurements of a wafer currently being etched and/or a recently etched wafer. Therefore, the processor 814 is able to provide feedback information and to control the fabrication system (e.g., etch component controller 818) which facilitates a more immediate correction in etch processes associated with the multi-sloped features. Measurements taken at pre-scheduled intervals or at particular pre-set stages of fabrication may not account for variations occurring between the pre-set or pre-scheduled checks. Variations occurring in the etch process may not be detectable at subsequent check points because other structures and layers may block the features from analysis. Unlike the indirect detection methods, feedback control in the present system 800 promotes a method for adjusting etch process conditions in order to facilitate controlling etch conditions in situ and to compensate for wafer-to-wafer variations, which is essential for improving fidelity of image transfer during the etch process and for reproducing multi-sloped features on one or more wafers.

Alternatively, or in addition, feed back control in the present system 800 facilitates etching subsequent wafers and/or subsequent multi-sloped features on the wafer 802.

The scatterometry system 822 employed in the measuring system may be any scatterometry system suitable to carry out the present invention and such systems are intended to fall within the scope of the claims appended hereto. Scatterometry systems are well known in the art, and therefore further discussion related thereto is limited for sake of brevity.

The processor 814 may be any of a plurality of processors, such as the AMD Athlon, AMD K7 and other similar and compatible processors. The manner in which the processor 814 can be programmed to carry out the functions relating to the present invention will be readily apparent to those having ordinary skill in the art based on the description provided herein.

A memory 816, which is operatively coupled to the processor 814, is also included in the system 800 and serves to store program code executed by the processor 814 for carrying out operating functions of the system 800 as described herein. The memory 816 also serves as a storage medium for temporarily storing information such as device profiles, device profile tables, device coordinate tables, device sizes, device shapes, scatterometry information, and other data that may be employed in carrying out the present invention.

A power supply 824 provides operating power to the system 800. Any suitable power supply (e.g., battery, line power) may be employed to carry out the present invention.

Figure 9:
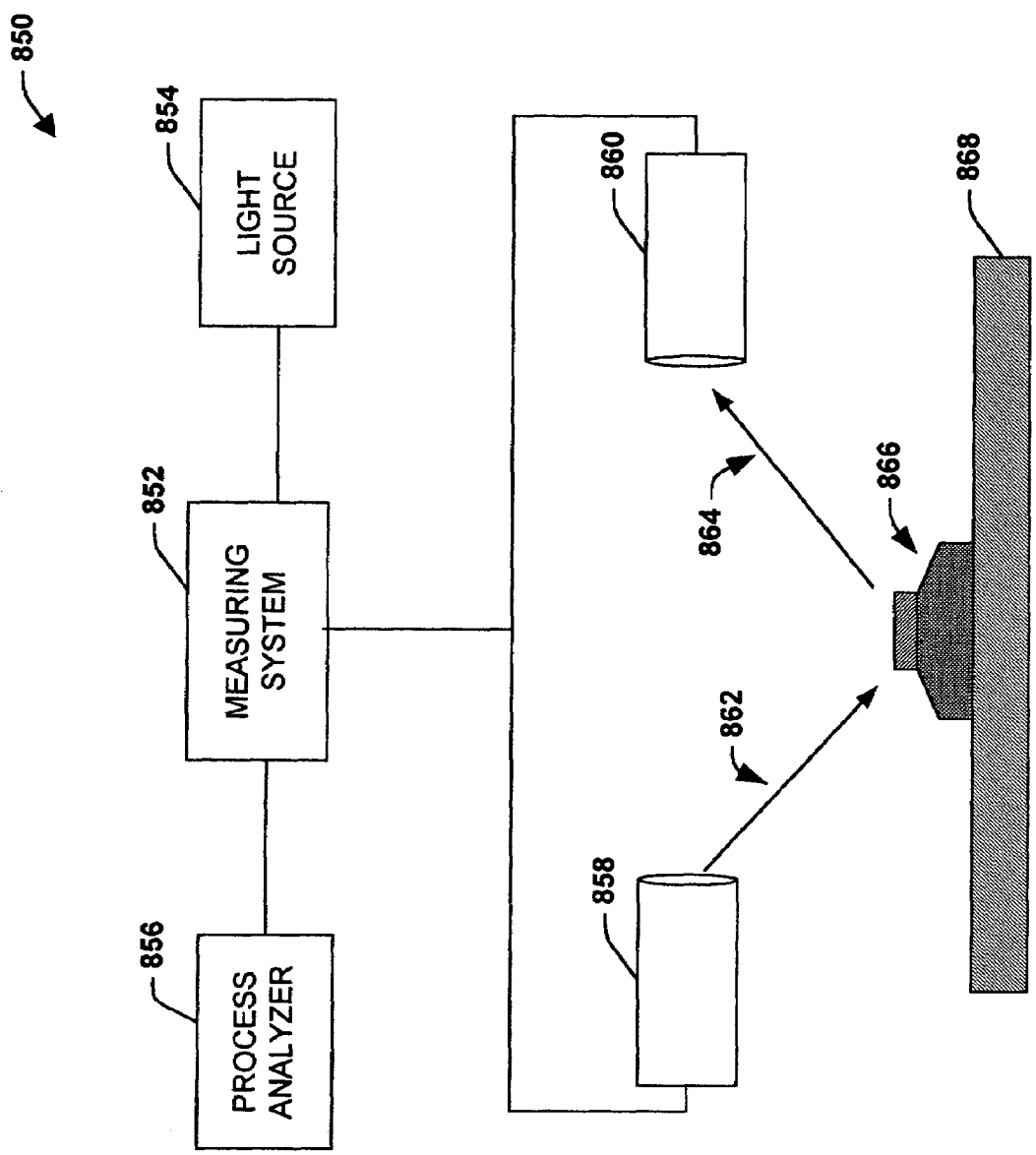
FIG. 9 is a partial schematic block diagram of a multi-sloped feature monitoring system in accordance with the present invention.

In FIG. 9, one example aspect of the system 800 is shown in greater detail. A system 850 is being employed to measure the etch parameters of the multi-sloped feature 866. The system 850 may also be programmed to measure no-slope features to mitigate variations on the entire wafer 868 from impacting other reproduced wafers. A light source 858 directs a light 862 incident to the surface of the wafer 868. The light 864 reflected from the wafer 868 will vary in accordance with parameters including the size and shape of the multi-sloped feature 866. Variations resulting from wafer imperfections or changes in the etch process conditions employed in fabricating the feature 866 may be identified by analyzing the reflected light 864. The one or more light detectors/receivers 860 collect the reflected light 864 and transmit or communicate the collected light to the multi-sloped measuring system 852. The multi-sloped measuring system 852 then interprets or converts the reflected light 864 into data measurements in accordance with scatterometry techniques in order to provide a process analyzer 856 with the measured data corresponding to the etching of the multi-sloped feature 866.

The process analyzer 856 then compares the measured data associated with the etched multi-sloped feature 866 (and no-slope features if desired) to stored acceptable values associated with a desired final profile or a desired final multi-sloped feature.

It should be understood that the process analyzer 856 may be programmed accordingly to compare corresponding portions of the feature, corresponding portions of the wafer, corresponding grid blocks of a wafer, entire features, entire wafers, and/or a combination thereof. Likewise, the desired final profile may be the profile of a desired multi-sloped feature or the profile of a desired wafer structure which may include a combination of one or more features formed thereon.

Turning now to FIGS. 10–12, another aspect of the system 800 is shown in greater detail. As discussed earlier, the wafer 802 may be partitioned into grid blocks wherein each grid block corresponds to a different part of the wafer. This method provides for improved accuracy in determining etch process conditions as they relate to the multi-sloped feature. In FIG. 10, a chuck 100 is shown in perspective supporting a wafer 1002 whereupon one or more multi-sloped features 1004 may be etched. The wafer 1002 may be divided into a grid pattern as shown in FIG. 11. Each grid block (XY) of the grid pattern corresponds to a particular portion of the wafer 1002. Each grid block may have one or more features 1004 associated with the grid block and/or may also have one or more parts of a feature 1004 associated with it. Each portion is individually regulated and individually controlled by the processor 814 via the etch component controller 818 to facilitate reproducing the etch process conditions from wafer to wafer for multi-sloped feature formation and to facilitate controlling the formation of the feature 1004 in situ.

In FIG. 11, one or more features 1004 in the respective portions of the wafer 1002 ($X_1Y_1 \ldots X_{12}, Y_{12}$) are being monitored for acceptability of etching using reflected light, the multi-slope measuring system 820 and the processor 814. The etching measurements for each feature 1004 are shown. As can be seen, the etching at coordinate $X_7Y_6$ is substantially different than the etching of the other portions XY. Such a difference may be due to variations within the wafer caused by prior manufacturing steps. Furthermore, such a difference may be an indication that a multi-sloped feature is being fabricated in an undesired manner. For example, an angle may be too acute, or too obtuse.

Still referring to FIG. 11, it should be appreciated that the wafer 1002 may be mapped or partitioned with any suitable number of portions having any suitable number of multi-sloped features and/or no-slope features etched thereon. Although the present invention is described with respect to one etching component 812 corresponding to one grid block XY, it is to be appreciated that any suitable number of etching components 812 may correspond to any suitable number of grid blocks XY.

FIG. 12 is a representative table of etching measurements taken for the various grid blocks that correlate to etch condition values for the respective grid blocks of the wafer 1002. As can be seen, all the grid blocks, except grid block $X_7Y_6$, have etch measurements corresponding to an acceptable etch table value (TA) (e.g., are within an expected range of etching measurements), while grid block $X_7Y_6$ has an undesired etch table value (Tu). Thus, the processor 814 may determine that an undesirable etch condition exists at the portion of the wafer 1002 mapped by grid block $X_7Y_6$. Accordingly, the processor 814 can instruct or control at least the etching component 812$_{7,6}$ which corresponds to the portion of the wafer 1002 mapped at grid block $X_7Y_6$, via the etch component controller 818, to mitigate the etch process variations at this portion of the wafer 802. It is to be appreciated that the etching components 812 may be regulated and controlled so as to maintain, increase or decrease the etching at the respective wafer 1002 portions in order to achieve the desired final profile or multi-sloped feature.

Figure 13:
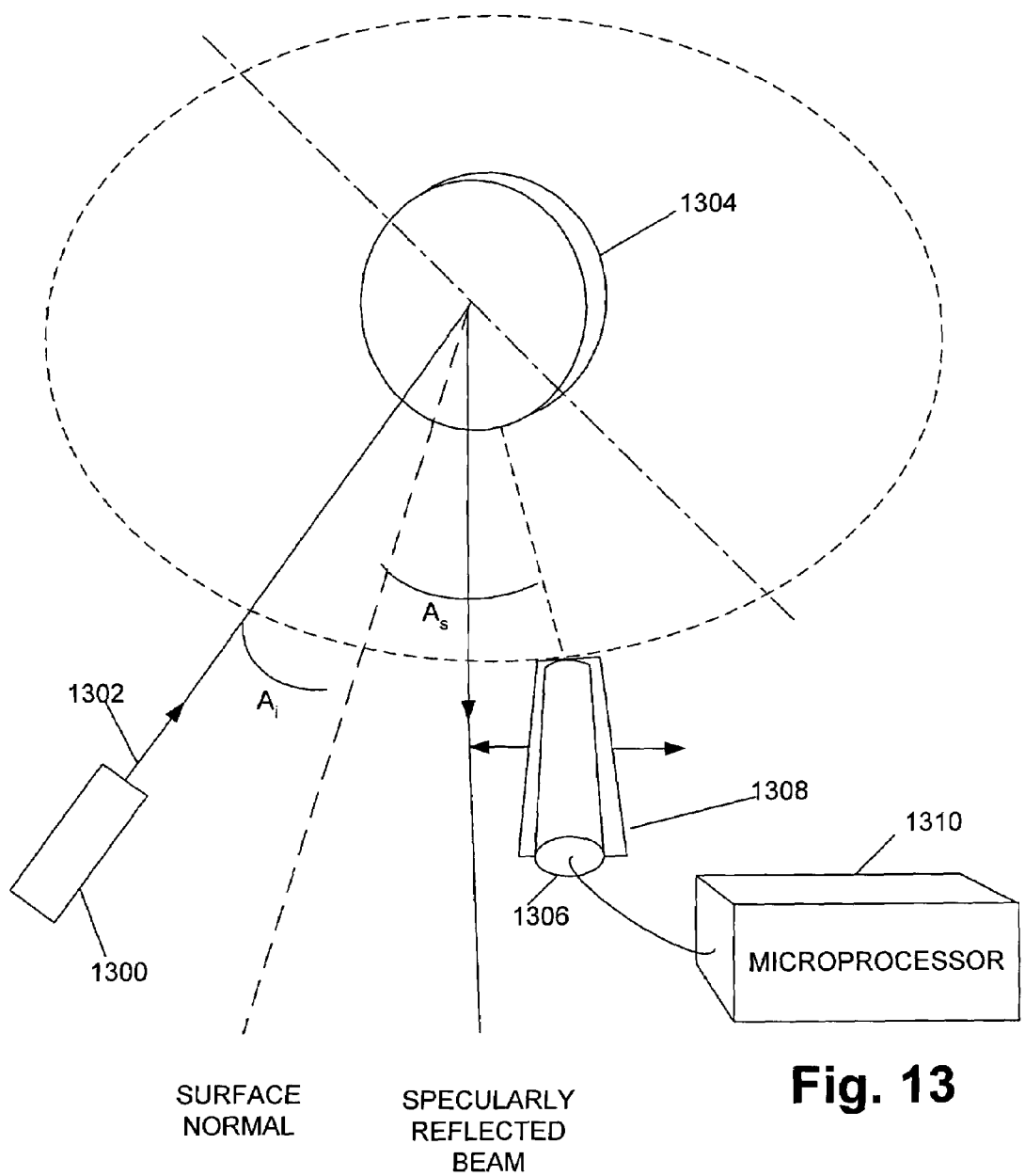
FIG. 13 illustrates an exemplary scatterometry system collecting reflected light in accordance with an aspect of the present invention.

FIG. 13 illustrates an exemplary scatterometry system collecting reflected light. Light from a laser 1300 is brought to focus in any suitable well-known manner to form a beam 1302. A sample, such as a wafer 1304 is placed in the path of the beam 1302 and a photo detector or photo multiplier 1306 of any suitable well-known construction. Different detector methods may be employed to determine the scattered power. To obtain a grating pitch, the photo detector or photo multiplier 1306 may be mounted on a rotation stage 1308 of any suitable well-known design. A microprocessor 1310, of any suitable well-known design, may be used to process detector readouts, including, but not limited to, angular locations of different diffracted orders leading to diffraction grating pitches being calculated. Thus, light reflected from the sample 1304 may be accurately measured. Accurately measuring the light reflected from the sample 1304 facilitates determining whether an unacceptable etching condition exists and thus enables feeding back control information to the system 800 so that more precise etching control may be achieved.

Figure 14:
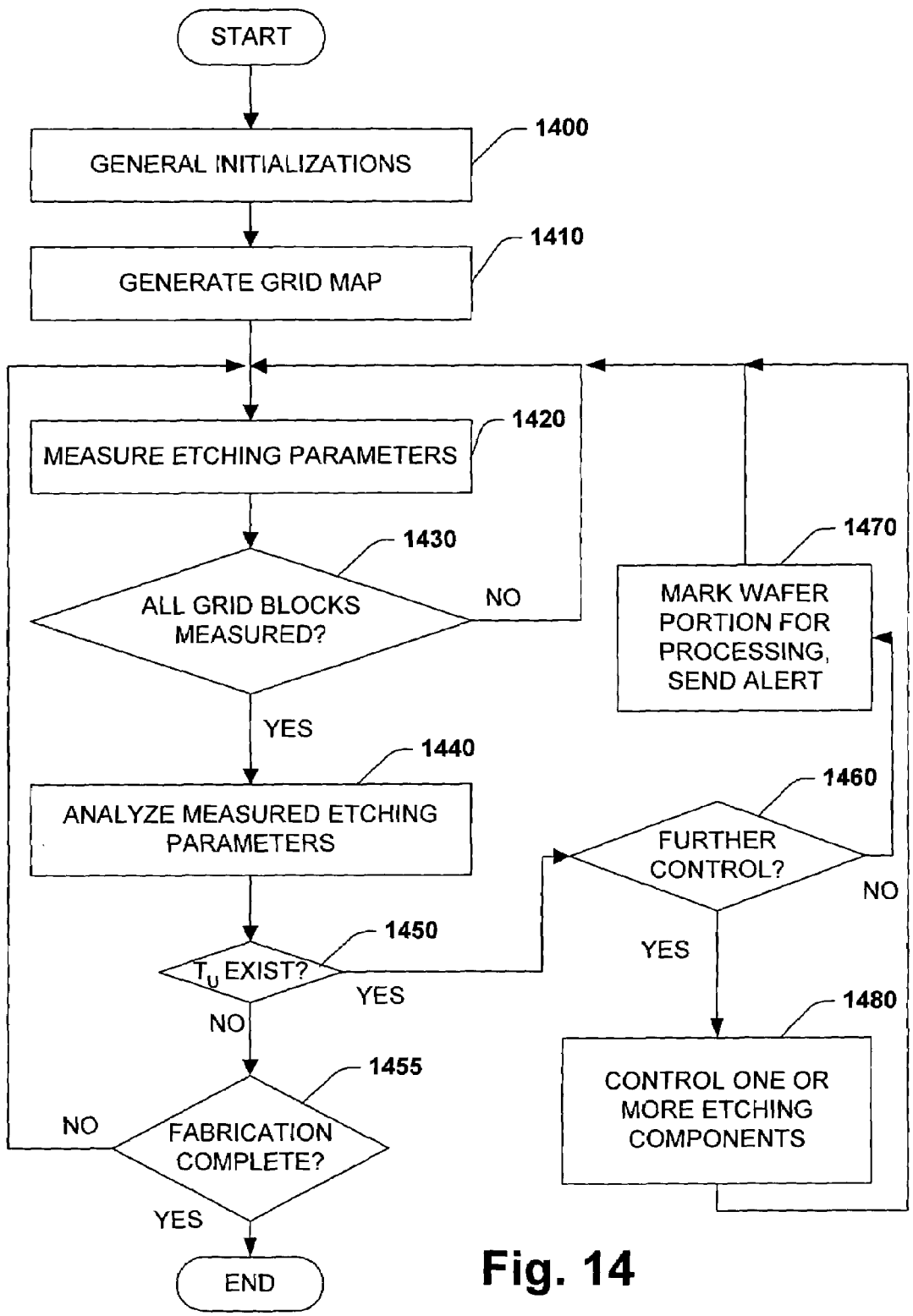
FIG. 14 is a flow diagram illustrating one specific methodology for carrying out the present invention.

In view of the exemplary systems shown and described above, methodologies, which may be implemented in accordance with the present invention will be better appreciated with reference to the flow diagram of FIG. 14. While for purposes of simplicity of explanation, the illustrated methodology is shown and described as a series of blocks, it is to be understood and appreciated that the present invention is not limited by the order of the blocks, as some blocks may, in accordance with the present invention, occur in different orders and/or concurrently with other blocks from that shown and described herein. Moreover, not all illustrated blocks may be required to implement a methodology in accordance with the present invention. Further, additional and/or alternative methodologies may employ additional blocks, not illustrated herein.

FIG. 14 is a flow diagram illustrating one particular methodology for carrying out the present invention. At 1400 general initializations occur. Such initializations can include, but are not limited to, allocating memory, establishing pointers, establishing data communications, acquiring resources, setting variables and displaying process activity. At 1410, the wafer is mapped into one or more grid blocks "XY", wherein a portion of a multi-sloped feature and/or one or more multi-sloped features are to be fabricated. At 1420, measurements are made concerning etching parameters associated with the various wafer portions mapped by the respective grid blocks XY. Such measurements are facilitated by collecting light reflected from a wafer and/or the features being fabricated thereon. For example, feature height, width, location, and one or more angles associated with the profile of the feature may be measured. At 1430, a determination is made concerning with all grid block measurements have been taken. If the determination at 1430 is NO, the control returns to 1420 where further measurements are taken. In an alternative example of the present invention, the determination at 1430 may be related to whether a sufficient number of measurements have been taken so that valid computations can be made concerning the acceptability of the formation of the features with the multi-sloped profiles. If the determination at 1430 is YES, then at 1440 the measured etching parameters are compared to stored etching values for the respective portions of the wafer. For example, analysis of the height, width, location and angle measurements taken at 1420 can be made. Such analysis can be employed to determine whether the multi-sloped feature is being fabricated with critical dimensions within desired tolerances. Such analysis can also be stored and employed to facilitate reproducing processing conditions for subsequent wafers fabricated in accordance with the present invention.

At 1450, a determination is made concerning whether etching values are acceptable. If the determination at 1450 is NO, that no unacceptable values exist, then a determination is made at 1455 concerning whether fabrication is complete. In an alternative example of the present invention, the determination at 1450 may concern whether an unacceptable number of unacceptable conditions exist. For example, a wafer with less than 0.01% errors may be acceptable. If the determination at 1455 is YES, then the particular iteration of the present methodology is concluded. If the determination at 1455 is NO, then control returns to 1420. If the determination at 1450 is YES, that unacceptable values exist, then control passes to 1460 where a determination is made concerning whether one or more components should be adapted in an attempt to mitigate the unacceptable condition, or whether the wafer should be marked for discard, for example. Additionally and/or alternatively, at 1460 information operable to facilitate reproducing process conditions can be stored for use by later processing runs. If the determination at 1460 is NO, that further control should not be attempted, then control passes to 1470 where the wafer portion may be marked for discard, and a signal to subsequent processes (e.g., quality control processes) may be sent. If the determination at 1460 is YES, that further control is desired, then at 1480 data operable to alter the operation of one or more fabrication components may be generated. For example, data operable to control an etching component may be generated to change the angle at which a directional etching component acts.

Figure 15:
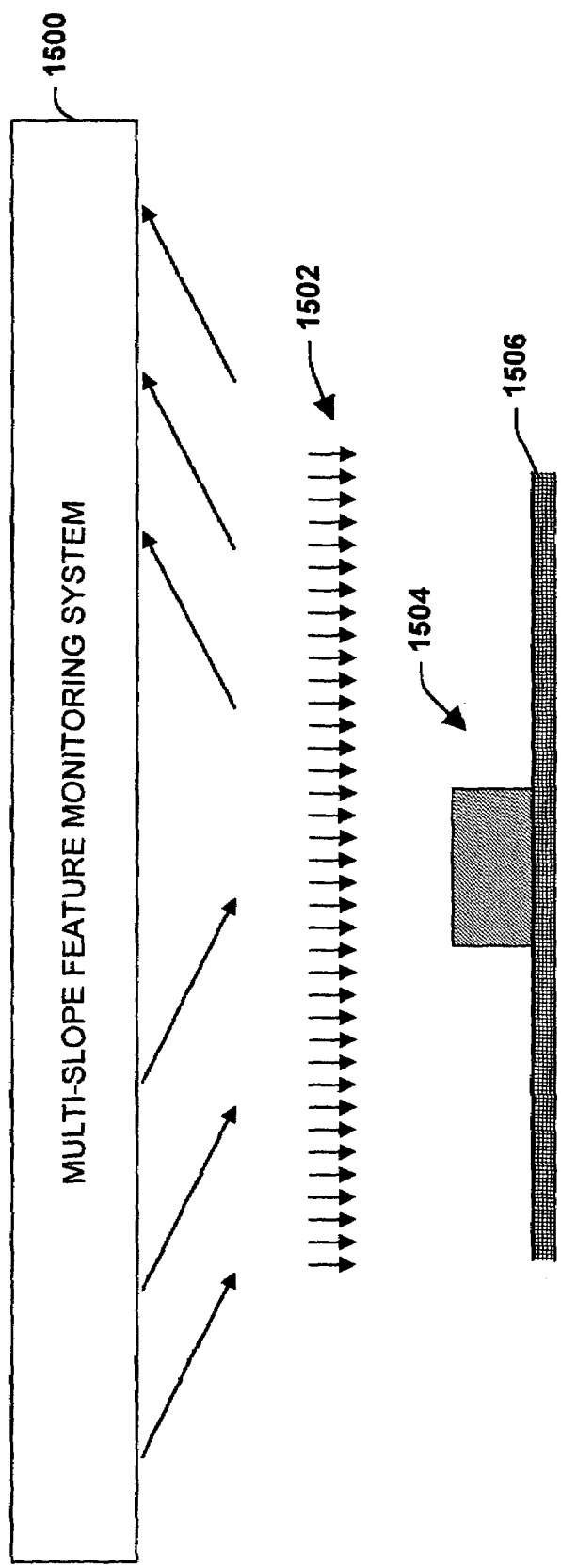
FIG. 15 illustrates a directional etch being employed in fabricating a multi-sloped feature, being monitored by a scatterometry system in accordance with an aspect of the present invention.
Figure 16:
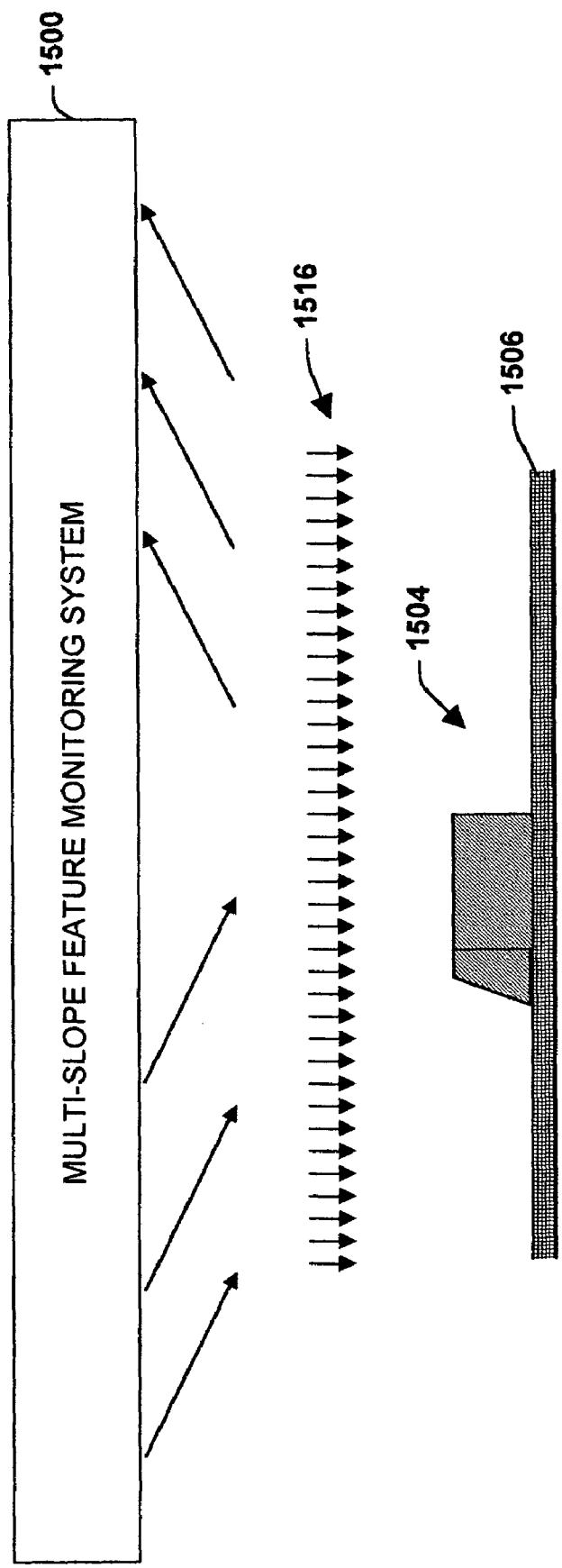
FIG. 16 illustrates a directional etch being employed in fabricating a multi-sloped feature, being monitored by a scatterometry system in accordance with an aspect of the present invention.
Figure 17:
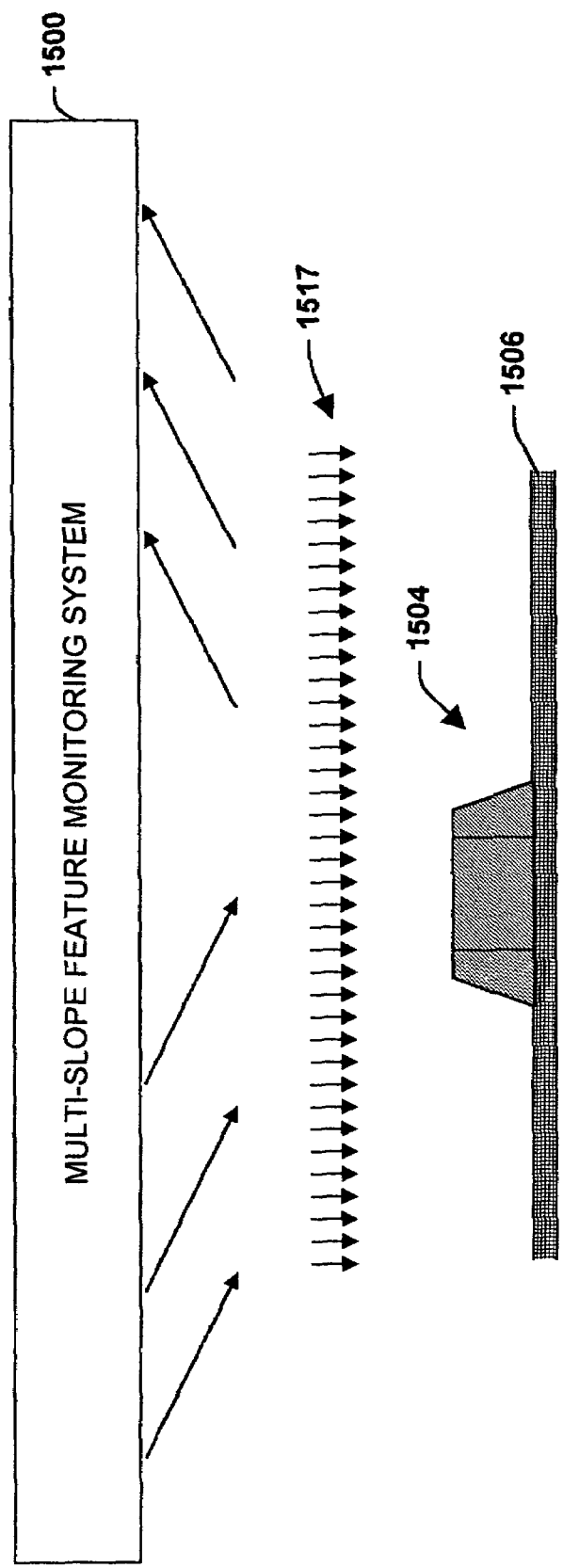
FIG. 17 illustrates a multi-sloped feature being monitored by a scatterometry system in accordance with an aspect of the present invention.

Turning now to FIGS. 15–17, an example fabrication process associated with forming a multi-sloped feature is examined. In FIG. 15, a multi-sloped feature monitoring system 1500 is illustrated directing light at a wafer 1506, whereupon a feature 1504 is being fabricated. At the fabrication point illustrated, the feature 1504 has yet to take on the recognizable aspects of a multi-sloped feature. The light being directed at the wafer 1506 and the feature 1504 is reflected back and collected by the multi-sloped feature monitoring system 1500, where it can be analyzed to produce information operable to control a directional etch process 1502 being applied to the wafer 1506 and the feature 1504. Conventional systems may employ pre-calculated parameters for controlling the directional etch 1502, and/or may stop the process at certain points to take snapshots of the progress of development. But the present invention facilitates directing light at the wafer 1506 and collecting light from the wafer 1506 while the etch process 1502 is in progress, and further facilitates producing feedback information operable to control the etch process 1502. By way of illustration, the etch process 1502 may proceed until information retrieved by analyzing the reflected light indicates that one or more desired intermediate critical dimensions (e.g., height, width, shape, angles) have been achieved. Once these critical dimensions have been achieved, then further processing may be performed to introduce the multi-slope attributes of the feature 1504.

Thus, turning to FIG. 16, the multi-sloped feature monitoring system 1500 is illustrated directing light at the wafer 1506, whereupon the feature 1504 is being fabricated. At the fabrication point illustrated, the feature 1504 has begun to take on a recognizable aspect of a multi-sloped feature. The feature 1504 is illustrated being acted upon by a directional etch 1516. The directional etch 1516 is creating a sloping wall on the left side of the feature 1504. The light reflected from the feature 1504 and/or the wafer 1506 is collected by the multi-sloped feature monitoring system 1500 and analyzed to determine information concerning intermediate critical dimensions associated with the feature (e.g., height, width, location, slope of the left wall). Such information can be employed to control the directional etch 1516 to, for example, maintain, increase or decrease the rate at which the etching proceeds, and/or to alter the direction of the etch. Furthermore, such information can be stored and employed in subsequent processing of similar features on the wafer 1506 and/or other wafers. By monitoring the progress of development of the feature 1504 in situ, improvements over conventional systems that do not perform such in situ analysis are achieved. For example, more precise features, with tighter tolerances on critical dimensions can be produced.

Turning now to FIG. 17, the multi-sloped feature monitoring system 1500 is illustrated directing light at the wafer 1506, whereupon the feature 1504 is being fabricated. At the fabrication point illustrated, the feature 1504 has begun to take on more recognizable aspects of a multi-sloped feature. The feature 1504 is illustrated being acted upon by a directional etch 1517 that is creating a sloping wall on the right side of the feature 1504. The light reflected from the feature 1504 and/or the wafer 1506 is collected by the multi-sloped feature monitoring system 1500 and analyzed to determine information concerning intermediate critical dimensions associated with the feature (e.g., height, width, location, slope of the right wall). Such information can be employed to control the directional etch 1517 to, for example, maintain, increase, decrease or stop the rate at which the etching proceeds, and/or to alter the direction of the etch. Furthermore, such information can be stored and employed in subsequent processing of similar features on the wafer 1506 and/or other wafers.

Although FIGS. 15–17 have illustrated a multi-sloped feature being fabricated primarily with directional etches, it is to be appreciated that other fabrication apparatus, techniques and processes known in the art may be applied to produce such features. The invention concerns monitoring the apparatus, techniques and processes employed to fabricate the feature and providing in situ feedback, produced through scatterometry techniques, to control the fabrication of the feature and/or other features on one or more wafers.

Scatterometry is a technique for extracting information about a surface upon which an incident light has been directed. Information concerning properties including, but not limited to, dishing, erosion, profile, thickness of thin films and critical dimensions of features present on the surface can be extracted. The information can be extracted by comparing the phase and/or intensity of the light directed onto the surface with phase and/or intensity signals of a complex reflected and/or diffracted light resulting from the incident light reflecting from and/or diffracting through the surface upon which the incident light was directed. The intensity and/or the phase of the reflected and/or diffracted light will change based on properties of the surface upon which the light is directed. Such properties include, but are not limited to, the chemical properties of the surface, the planarity of the surface, features on the surface, voids in the surface, and the number and/or type of layers beneath the surface.

Different combinations of the above-mentioned properties will have different effects on the phase and/or intensity of the incident light resulting in substantially unique intensity/phase signatures in the complex reflected and/or diffracted light. Thus, by examining a signal (signature) library of intensity/phase signatures, a determination can be made concerning the properties of the surface. Such substantially unique phase/intensity signatures are produced by light reflected from and/or refracted by different surfaces due, at least in part, to the complex index of refraction of the surface onto which the light is directed. The complex index of refraction (N) can be computed by examining the index of refraction (n) of the surface and an extinction coefficient (k). One such computation of the complex index of refraction can be described by the equation:

$$N = n - jk$$

where j is an imaginary number.

The signal (signature) library can be constructed from observed intensity/phase signatures and/or signatures generated by modeling and simulation. By way of illustration, when exposed to a first incident light of known intensity, wavelength and phase, a first feature on a wafer can generate a first phase/intensity signature. Similarly, when exposed to the first incident light of known intensity, wavelength and phase, a second feature on a wafer can generate a second phase/intensity signature. For example, a line of a first width may generate a first signature while a line of a second width may generate a second signature. Observed signatures can be combined with simulated and modeled signatures to form the signal (signature) library. Simulation and modeling can be employed to produce signatures against which measured phase/intensity signatures can be matched. In one exemplary aspect of the present invention, simulation, modeling and observed signatures are stored in a signal (signature) library containing over three hundred thousand phase/intensity signatures. Thus, when the phase/intensity signals are received from scatterometry detecting components, the phase/intensity signals can be pattern matched, for example, to the library of signals to determine whether the signals correspond to a stored signature.

Figure 18:
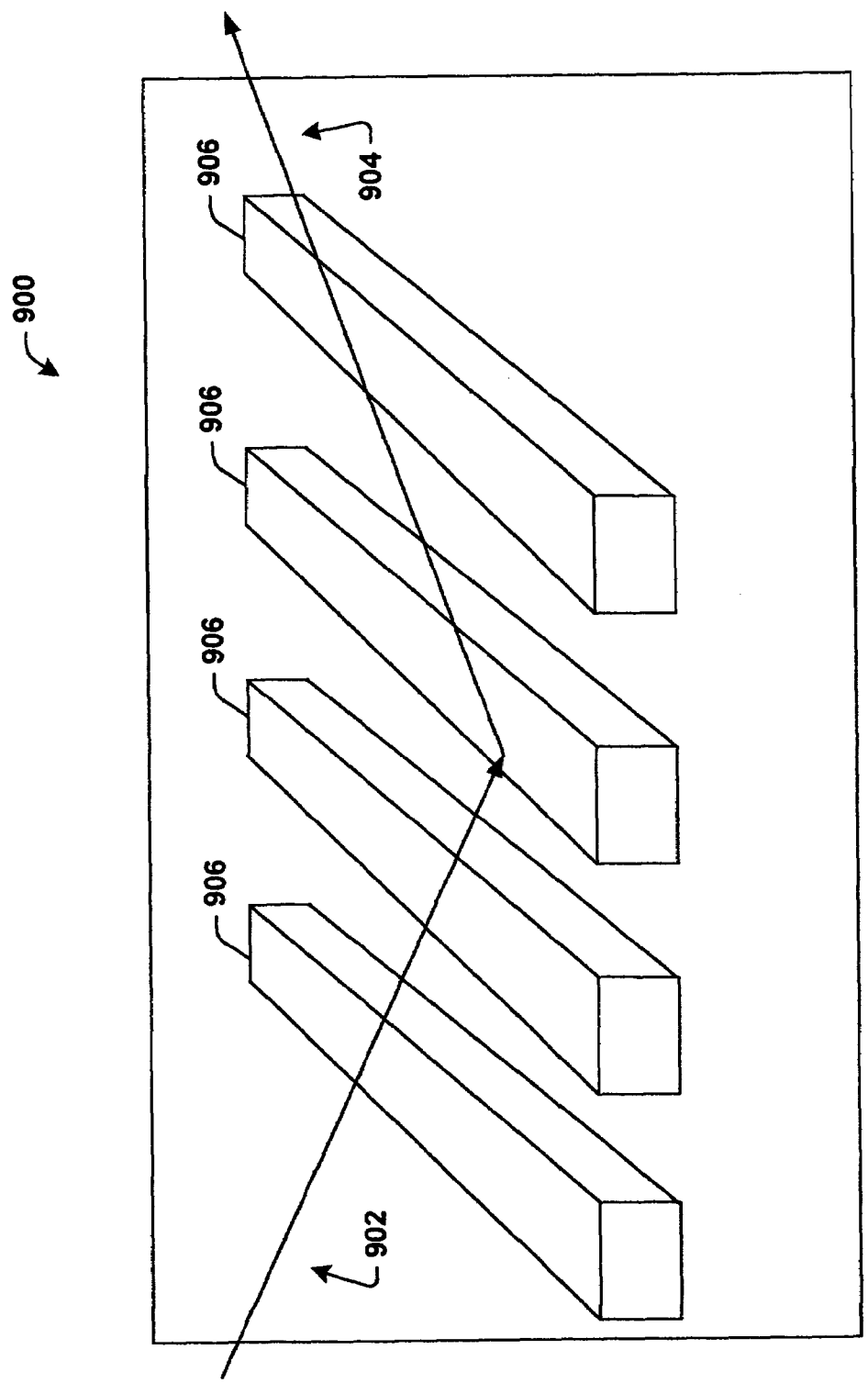
FIG. 18 is a simplified perspective view of an incident light reflecting off a surface, in accordance with an aspect of the present invention.
Figure 23:
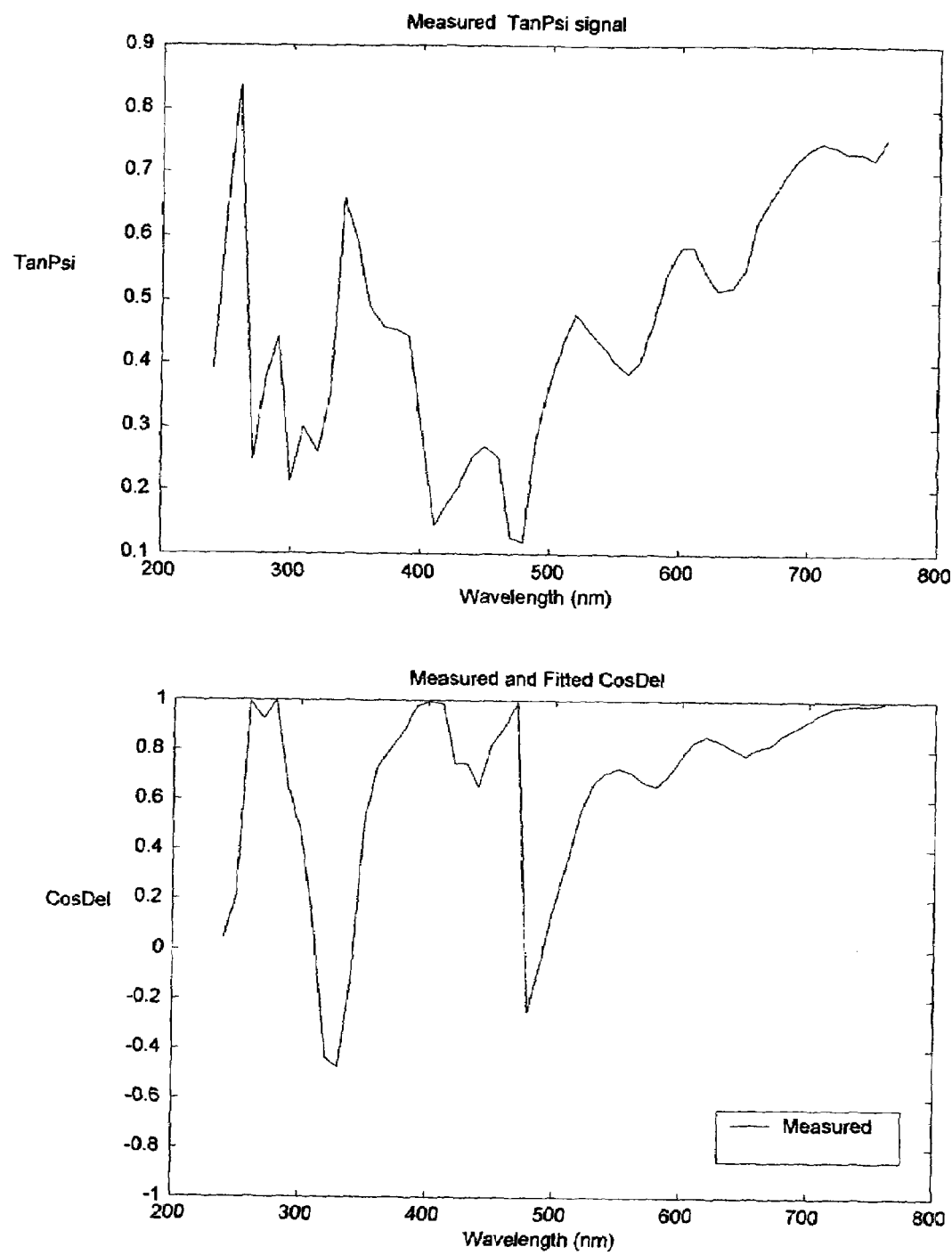
FIG. 23 illustrates phase and intensity signals recorded from a complex reflected and refracted light produced when an incident light is directed onto a surface, in accordance with an aspect of the present invention.

To illustrate the principles described above, reference is now made to FIGS. 18 through 23. Referring initially to FIG. 18, an incident light 902 is directed at a surface 900, upon which one or more features 906 may exist. The incident light 902 is reflected as reflected light 904. The properties of the surface 900, including but not limited to, thickness, uniformity, planarity, chemical composition and the presence of features, can affect the reflected light 904. The features 906 are raised upon the surface 900. The phase and intensity of the reflected light 904 can be measured and plotted, as shown, for example, in FIG. 23. The phase of the reflected light 904 can be plotted, as can the intensity of the reflected light 904. Such plots can be employed to compare measured signals with signatures stored in a signature library using techniques like pattern matching, for example.

Figure 19:
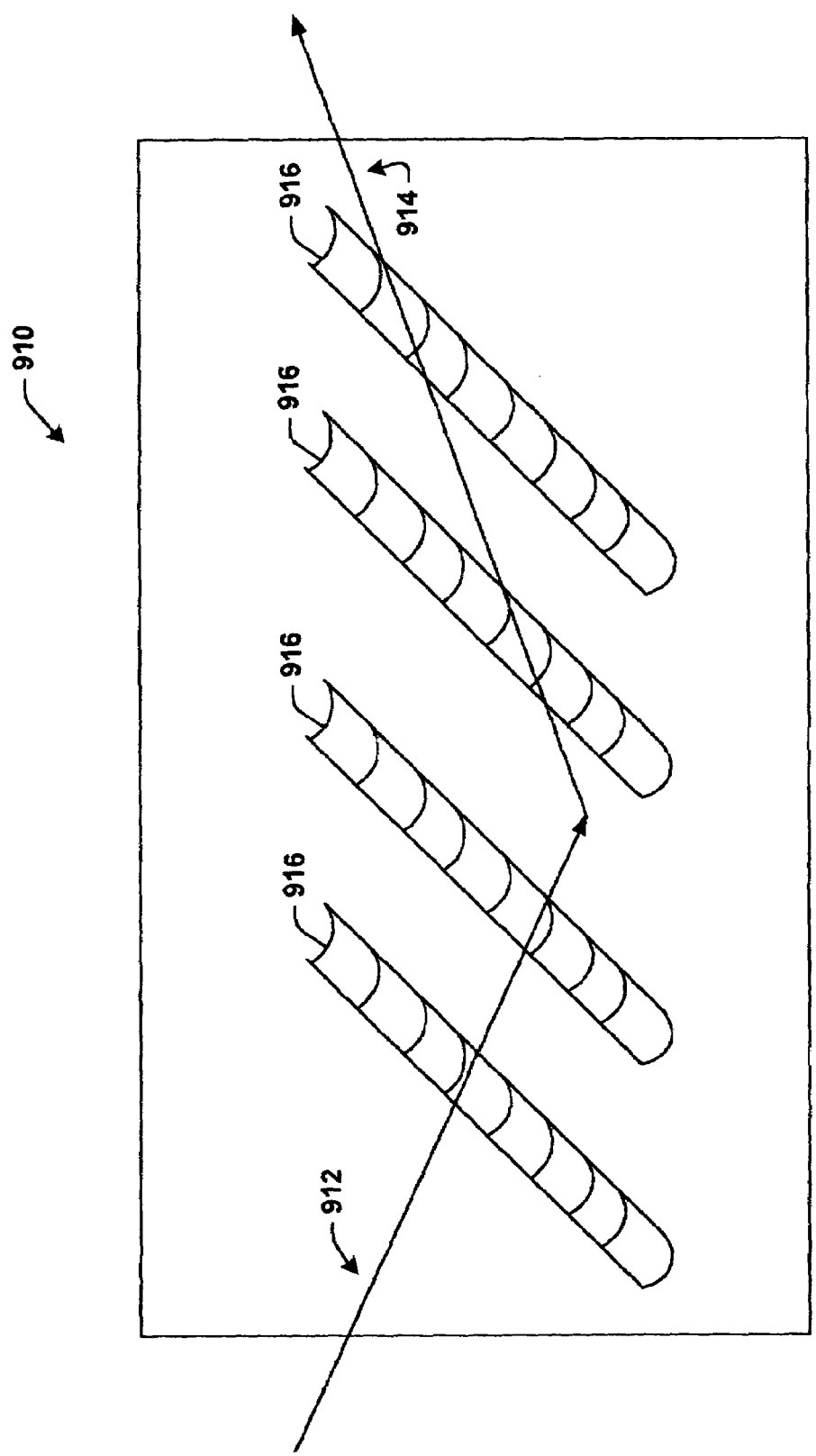
FIG. 19 is a simplified perspective view of an incident light reflecting off a surface, in accordance with an aspect of the present invention.

Referring now to FIG. 19, an incident light 912 is directed onto a surface 910 upon which one or more depressions 916 appear. The incident light 912 is reflected as reflected light 914. Like the one or more features 906 (FIG. 18) may affect an incident beam, so too may the one or more depressions 916 affect an incident beam. Thus, it is to be appreciated that scatterometry can be employed to measure features appearing on a surface, features appearing in a surface, and properties of a surface itself, regardless of features.

Figure 20:
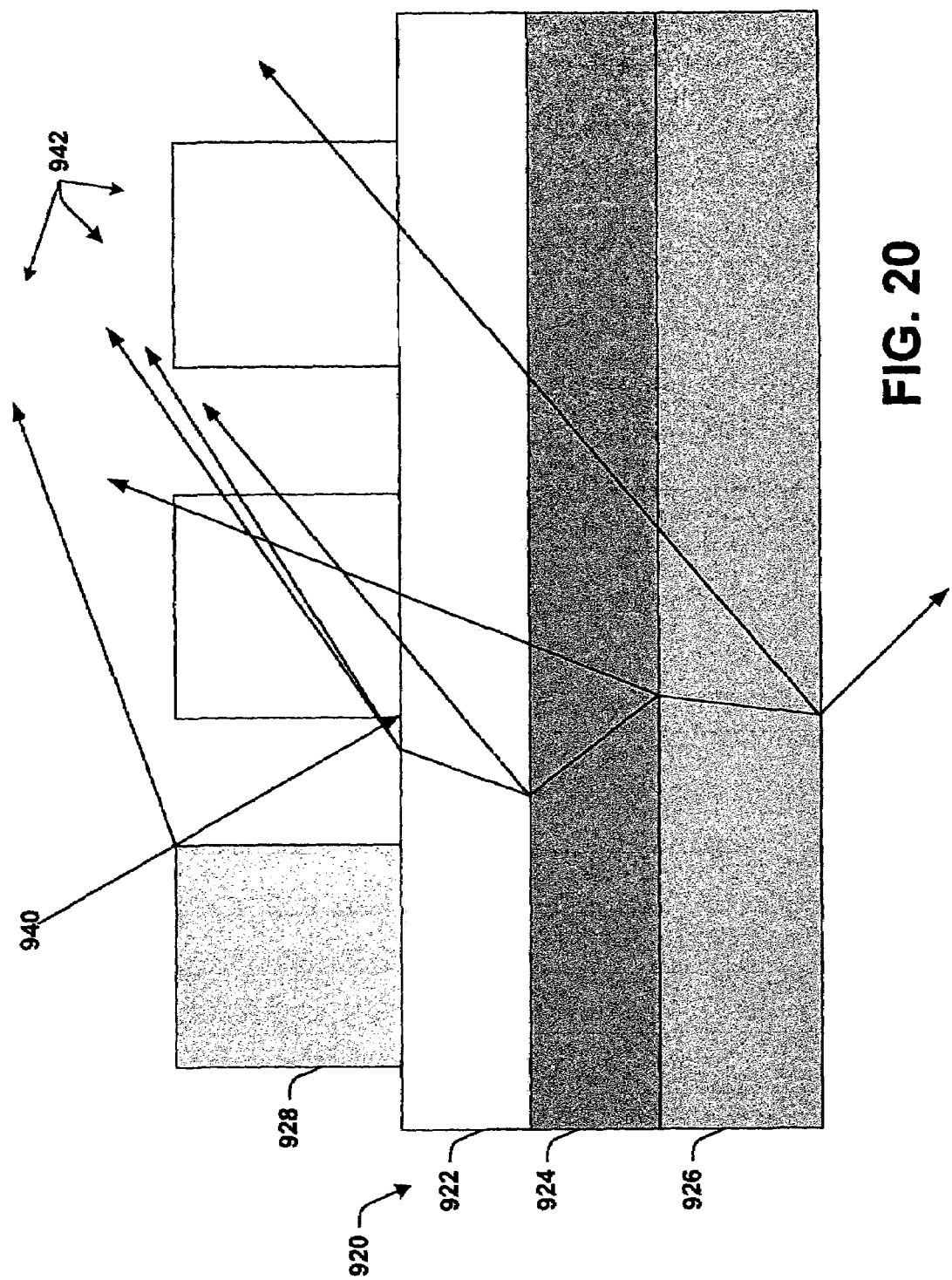
FIG. 20 illustrates a complex reflected and refracted light produced when an incident light is directed onto a surface, in accordance with an aspect of the present invention.

Turning now to FIG. 20, complex reflections and refractions of an incident light 940 are illustrated. The reflection and refraction of the incident light 940 can be affected by factors including, but not limited to, the presence of one or more features 928, the slopes of the features 928 and the composition of the substrate 920 upon which the features 928 reside. For example, properties of the substrate 920 including, but not limited to the thickness of a layer 922, the chemical properties of the layer 922, the opacity and/or reflectivity of the layer 922, the thickness of a layer 924, the chemical properties of the layer 924, the opacity and/or reflectivity of the layer 924, the thickness of a layer 926, the chemical properties of the layer 926, and the opacity and/or reflectivity of the layer 926 can affect the reflection and/or refraction of the incident light 940. Thus, a complex reflected and/or refracted light 942 may result from the incident light 940 interacting with the features 928, and/or the layers 922, 924 and 926. Although three layers 922, 924 and 926 are illustrated in FIG. 20, it is to be appreciated by one skilled in the art that a substrate can be formed of a greater or lesser number of such layers.

Figure 21:
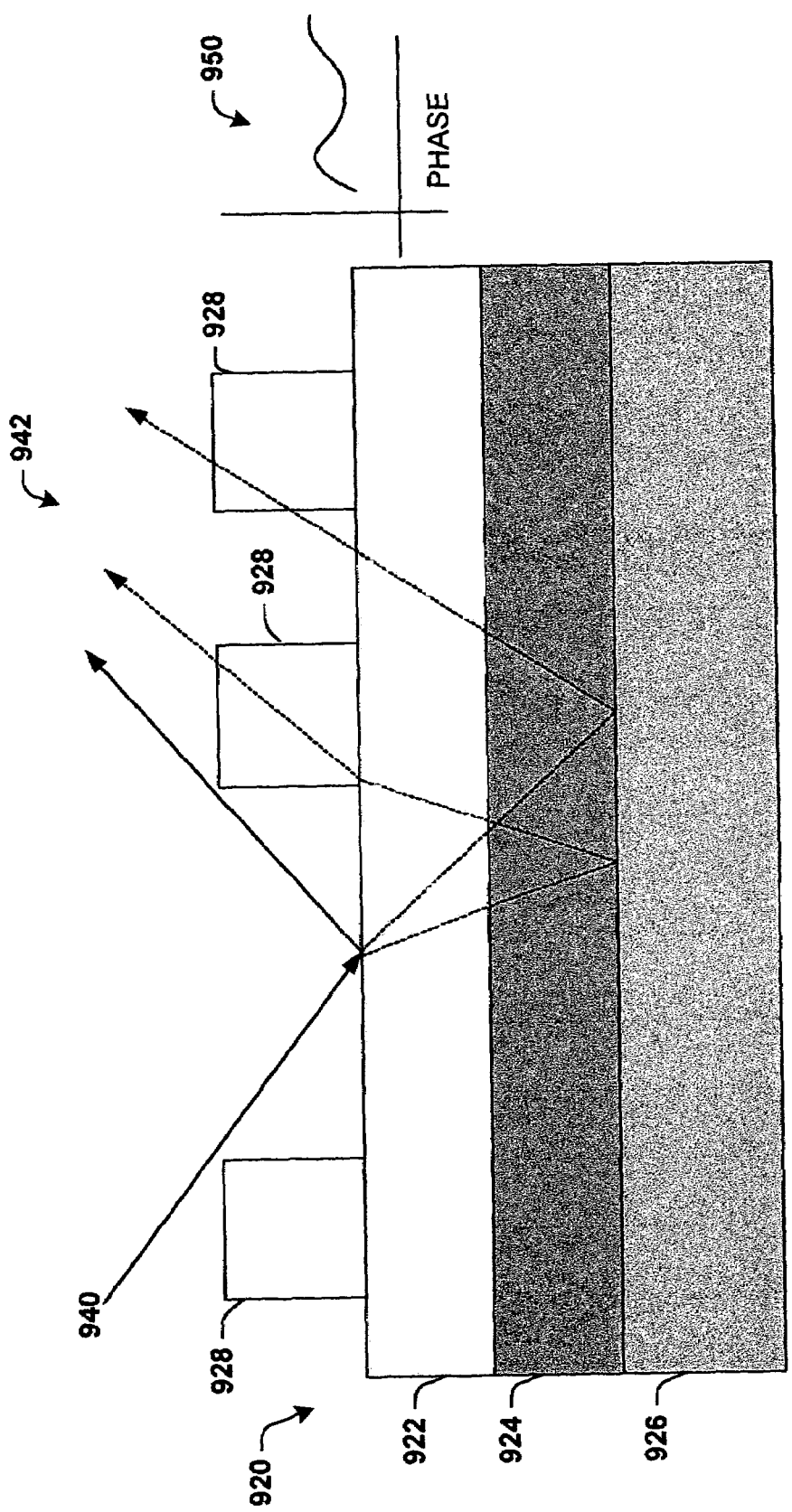
FIG. 21 illustrates a complex reflected and refracted light produced when an incident light is directed onto a surface, in accordance with an aspect of the present invention.
Figure 22:
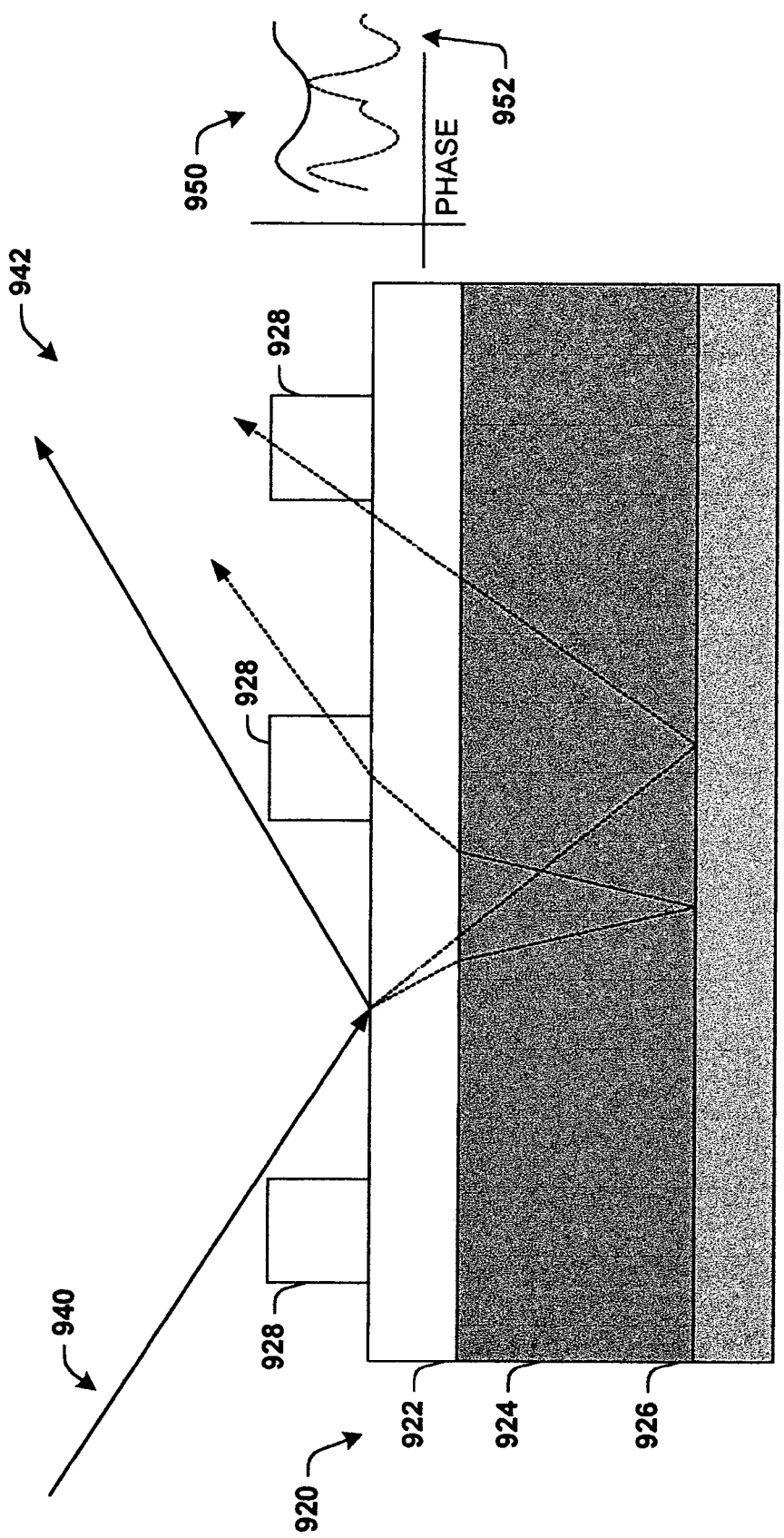
FIG. 22 illustrates a complex reflected and refracted light produced when an incident light is directed onto a surface, in accordance with an aspect of the present invention.

Turning now to FIG. 21, one of the properties from FIG. 20 is illustrated in greater detail. The substrate 920 can be formed of one or more layers 922, 924 and 926.

The phase 950 of the reflected and/or refracted light 942 can depend, at least in part, on the thickness of a layer, for example, the layer 924. Thus, in FIG. 22, the phase 952 of the reflected light 942 differs from the phase 950 due, at least in part, to the different thickness of the layer 924 in FIG. 22.

Thus, scatterometry is a technique that can be employed to extract information about a surface upon which an incident light has been directed. The information can be extracted by analyzing phase and/or intensity signals of a complex reflected and/or diffracted light. The intensity and/or the phase of the reflected and/or diffracted light will change based on properties of the surface upon which the light is directed, resulting in substantially unique signatures that can be analyzed to determine one or more properties of the surface upon which the incident light was directed.

What has been described above includes examples of the present invention. It is of course, not possible to describe every conceivable combination of components or methodologies for purposes of describing the present invention, but one of ordinary skill in the art may recognize that many further combinations and permutations of the present invention are possible. Accordingly, the present invention is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising", as comprising is interpreted as a transitional word in a claim.

What is claimed is:

1. A system for in-situ regulation of an etch process employed in fabricating a multi-sloped semiconductor feature on a wafer, comprising:
   one or more etching components associated with each of a plurality of grid blocks associated with a wafer and operative to etch at least one aspect of a multi-sloped feature on the wafer;
   an etch component controller for controlling the one or more etching components;
   a system for directing light onto the wafer;
   a measuring system for measuring at least one etching parameter based on light reflected from the wafer; and
   a process analyzer operatively coupled to the measuring system and the etch component controller, wherein the process analyzer receives the measured parameters from the measuring system and analyzes the measured parameters to determine whether adjustments to the etching components are needed to fabricate the multi-sloped features within desired critical dimension tolerances and where the process analyzer stores the measured parameters to facilitate reproducing process conditions.

2. The system of claim 1, the measuring system further including a scatterometry system for collecting the reflected light, wherein the measuring system interprets the reflected light to produce the measured etch parameters using scatterometry techniques.

3. The system of claim 2, wherein the measured etch parameters include at least one of feature height, feature width, slope of one or more feature sides and angles between feature sides.

4. The system of claim 3, wherein the multi-sloped feature has one or more angles between feature sides that are not right angles.

5. The system of claim 1, wherein the process analyzer determines that adjustments to one or more etching components are necessary for at least a portion of the wafer by comparing one or more measured etch parameter values to one or more stored acceptable etch parameter values.

6. The system of claim 5, wherein the stored acceptable etch parameter values are stored as scatterometry signatures.

7. A method for in-situ regulation of a process for etching a multi-sloped semiconductor device formed on a wafer, comprising:
   partitioning the wafer into at least two individually regulated and individually controlled portions;
   etching at least one multi-sloped device on at least one portion of the wafer;
   directing light onto at least one portion of the wafer;
   collecting light reflected from the at least one portion;
   analyzing the reflected light to determine the acceptability of the multi-sloped semiconductor device on the at least one portion;
   storing data associated with the acceptability of the multi-sloped semiconductor device and one or more processing conditions associated with creating the multi-sloped semiconductor device to facilitate reproducing the one or more processing conditions; and
   selectively controlling one or more etching components to regulate the etching of the multi-sloped semiconductor device on the at least one portion.

8. The method of claim 7, wherein the light is collected by a scatterometry measuring system.

9. The method of claim 8, wherein the scatterometry measuring system interprets the reflected light into measured etch parameters associated with the at least one portion using scatterometry techniques.

10. The method of claim 9, wherein the measured etch parameters are compared to stored acceptable etch parameter values in order to determine whether one or more adjustments to the process for etching a multi-sloped semiconductor device formed on a wafer is necessary.

11. A method for in-situ regulation of an etch process of a multi-sloped semiconductor device formed on a wafer, comprising:
   partitioning the wafer into a plurality of independently controlled and independently regulated grid blocks;
   using one or more etching components to etch a multi-sloped semiconductor feature on the wafer, each etching component functionally corresponding to a respective grid block;
   measuring at least one etch parameter associated with the multi-sloped semiconductor feature;
   determining etching conditions at each of the plurality of grid blocks according to the measured etch parameter; and
   using a process analyzer to selectively control the plurality of etching components to compensate for wafer to wafer variations during the etch process of the multi-sloped feature.

12. A system for in-situ regulation of an etch process of a multi-sloped semiconductor device formed on a wafer, comprising:
   means for partitioning the wafer into a plurality of independently regulated and independently controlled portions;
   means for etching at least one multi-sloped device on at least one portion of the wafer;
   means for associating each of the plurality of portions with the means for etching;
   means for directing light onto at least one portion of the wafer;
   means for collecting light reflected from the at least one portion;
   means for analyzing the reflected light to determine the acceptability of the etching of the at least one portion; and
   means for selectively controlling one or more etching components to regulate the etching of the multi-sloped semiconductor device on the at least one portion.

13. A data packet adapted to be transmitted between two or more processes, the data packet containing information related to in-situ adaptation of an etch process employed in fabricating a multi-sloped semiconductor device, where the information was generated by a system for in-situ regulation of an etch process employed in fabricating a multi-sloped semiconductor feature on a wafer, the system comprising:

a plurality of individually regulated and individually controlled partitions associated with the wafer;

one or more etching components operative to etch at least one aspect of a multi-sloped feature on the wafer;

an etch component controller for controlling the one or more etching components;

a system for directing light onto the wafer;

a measuring system for measuring at least one etching parameter based on light reflected from the wafer; and a process analyzer operatively coupled to the measuring system and the etch component controller, wherein the process analyzer receives the measured parameters from the measuring system and analyzes the measured parameters to determine whether adjustments to the etching components are needed to fabricate the multi-sloped features within desired critical dimension tolerances and where the process analyzer stores the measured parameters to facilitate reproducing process conditions.

14. A method employed for manufacturing semiconductor devices, comprising:

determining a desired multi-sloped profile;

etching at least one device to conform to the desired multi-sloped profile;

detecting in situ parameters of the etching of the device utilizing scatterometry; and adjusting the etching of the multi-sloped profile at each of a plurality of individually regulated and individually controlled portions of a wafer as necessary to produce the desired multi-sloped profile.

15. The method of claim 14, further including storing the desired multi-sloped profile.

16. The method of claim 14, further including analyzing the parameters of the etching of the device.

17. The method of claim 16, wherein analyzing includes comparing current parameters to previous parameters.

18. The method of claim 14, further including storing the parameters found while detecting in situ parameters.

19. The method of claim 14, wherein adjusting the etching of the multi-sloped profile includes at least one from a group consisting of reducing a rate of etching and increasing a rate of etching.

20. The method of claim 14, further including controlling light sources utilized in detecting in situ parameters.

21. The method of claim 20, wherein controlling light sources includes at least one from a group consisting of reducing a light source intensity, increasing a light source intensity and altering an angle of a light source.

22. The method of claim 14, further including controlling light receivers utilized in detecting in situ parameters.

23. The method of claim 22, wherein controlling light receivers includes at least one from a group consisting of reducing a light receiver sensitivity, increasing a light receiver sensitivity and altering an angle of a light receiver.

24. A semiconductor device manufacturing system, comprising:

at least one etch component for etching a device to conform to a desired multi-sloped profile, the at least one etch component associated with a plurality of independently regulated and independently controlled grid blocks that map to a wafer;

a detecting system employing scatterometry for detecting in situ parameters related to the etching of the device; and an etch component controller capable of receiving information from the detecting system to control the etch component as necessary to produce the desired multi-sloped profile.

25. The system of claim 24, further comprising an analysis system to analyze in situ parameters provided by the detecting system.

26. The system of claim 25, the analysis system additionally analyzes in situ parameters based on at least one from a group consisting of current in situ parameters, previous in situ parameters, scatterometry signature profiles, and predetermined multi-sloped profiles.

27. The system of claim 24, further comprising a storage medium for storing at least one from a group consisting of current in situ parameters, previous in situ parameters, scatterometry signature profiles, and predetermined multi-sloped profiles.

28. A system for manufacturing semiconductor devices, comprising:

means for etching at least one device to conform to a desired multi-sloped profile;

means for detecting in situ parameters of the etching of the device utilizing scatterometry;

means for analyzing a plurality of individually regulated and individually controlled portions associated with a wafer; and means for adjusting the etching of the multi-sloped profile as necessary to produce the desired multi-sloped profile.

* * * * *